(12) United States Patent
Chang

(10) Patent No.: US 9,195,243 B2
(45) Date of Patent: Nov. 24, 2015

(54) SYSTEM AND METHOD OF SAFE AND EFFECTIVE ENERGY USAGE AND CONSERVATION FOR DATA CENTERS WITH RACK POWER DISTRIBUTION UNITS

(75) Inventor: Herlin Chang, Shijr (TW)

(73) Assignee: ATEN INTERNATIONAL CO., LTD., Shijr (TW)

( * ) Notice: Subject to any disclaimer, the term of this patent is extended or adjusted under 35 U.S.C. 154(b) by 838 days.

(21) Appl. No.: 13/246,598

(22) Filed: Sep. 27, 2011

(65) Prior Publication Data

US 2012/0303166 A1 Nov. 29, 2012

Related U.S. Application Data

(60) Provisional application No. 61/489,654, filed on May 24, 2011.

(51) Int. Cl.
*G06F 3/00* (2006.01)
*G06F 3/01* (2006.01)
*G06F 3/033* (2013.01)
(Continued)

(52) U.S. Cl.
CPC ........ *G05D 23/1932* (2013.01); *H05K 7/20836* (2013.01)

(58) Field of Classification Search
CPC .................................................. G05D 23/1951
USPC ............ 702/50, 61, 127, 128, 182, 188, 194; 361/695; 455/507; 713/340
See application file for complete search history.

(56) References Cited

U.S. PATENT DOCUMENTS 7,509,865 B2  3/2009  Burczyk et al.
7,877,235 B2 * 1/2011  McConnell et al. .......... 702/188
(Continued)

FOREIGN PATENT DOCUMENTS

CN    1795706    6/2006
CN    1908590    2/2007
(Continued)

OTHER PUBLICATIONS

Herrlin, Ancis Inc., "Improved Data Center Energy Efficiency and Thermal Performance by Advanced Airflow Analysis", Digital Power Forum 2007, Sep. 10-12, 2007, San Francisco, CA.

(Continued)

*Primary Examiner* — Toan Le
*Assistant Examiner* — Felix Suarez
(74) *Attorney, Agent, or Firm* — Chen Yoshimura LLP

(57) ABSTRACT

A system and method for improving energy usage and conservation of at least one air-management unit in a data center where a multiplicity of rack mounted power distribution units are used for power distribution to a multiplicity of electronic devices mounted on a plurality of racks in at least one computer room of the data center. A group of power load, temperature, humidity and differential pressure sensors are provided throughout the racks, and coupled to a computer through a network interface for automatically calculating multiple air-management effectiveness and energy efficiency indices (e.g., rack cooling index RCI, rack humidity index RHI, rack airflow index RAI, rack differential pressure index RPI and return temperature index RTI) based on the data from the sensors, such that the operation of the air-management unit can be adjusted accordingly to achieve an optimal efficiency of safe energy usage and conservation.

35 Claims, 29 Drawing Sheets

(51) Int. Cl.
*G06F 1/26* (2006.01)
*G05D 23/19* (2006.01)
*H05K 7/20* (2006.01)

(56) References Cited

U.S. PATENT DOCUMENTS

| | | | |
|---|---|---|---|
| 7,885,795 B2 | 2/2011 | Rasmussen et al. | |
| 8,147,302 B2 * | 4/2012 | Desrochers et al. | 454/228 |
| 8,514,572 B2 * | 8/2013 | Rogers | 361/695 |
| 8,588,830 B2 * | 11/2013 | Myer et al. | 455/507 |
| 2004/0240514 A1 | 12/2004 | Bash et al. | |
| 2005/0023363 A1 | 2/2005 | Sharma et al. | |
| 2007/0032979 A1 | 2/2007 | Hamann et al. | |
| 2007/0125107 A1 | 6/2007 | Beam | |
| 2008/0174954 A1 | 7/2008 | Vangilder et al. | |
| 2008/0239539 A1 | 10/2008 | Hamann et al. | |
| 2008/0281551 A1 | 11/2008 | Hamann et al. | |
| 2008/0307803 A1 * | 12/2008 | Herzon | 62/93 |
| 2010/0186517 A1 | 7/2010 | Bean, Jr. | |
| 2010/0304657 A1 | 12/2010 | Gallmann et al. | |
| 2011/0014862 A1 | 1/2011 | Honold et al. | |
| 2012/0054527 A1 * | 3/2012 | Pfeifer et al. | 713/340 |
| 2012/0059628 A1 | 3/2012 | Vangilder et al. | |

FOREIGN PATENT DOCUMENTS

| | | |
|---|---|---|
| CN | 101053291 | 10/2007 |
| CN | 101589656 | 11/2009 |
| CN | 101855952 | 10/2010 |
| CN | 101968250 | 2/2011 |
| TW | I274455 | 2/2007 |
| TW | 200904118 | 1/2009 |
| TW | M379266 | 4/2010 |
| TW | I339627 | 4/2011 |

OTHER PUBLICATIONS

Chinese Office Action, dated Jan. 28, 2014, in a counterpart Chinese patent application, No. CN 201210047805.2.
Taiwanese Office Action, dated Jul. 25, 2014, in a counterpart Taiwanese patent application, No. TW 100148267.

* cited by examiner

Power Management
Average Heat Load Density L kW: 2    Var(L) W: 530
Average Heat Load Usage U kWH: 200    Var(U) kWH: 53

Thermal Management
Average Cold Intake Temperature t °F: 65    Var(t) °F: 20
Average Hot Exhaust Temperature T °F: 90    Var(T) °F: 20
Average Intake Differential Temperature $\Delta t$ °F: 10    Var($\Delta t$) °F: 5
Average Exhaust Differential Temperature $\Delta T$ °F: 10    Var($\Delta t$) °F: 10
Average Cold-Hot Temperature Rise $\Delta T_{Equip}$ °F: 25    Var($\Delta T_{Equip}$) °F: 10

Air Management
Average Differential Pressure $\Delta P$ Pa: 50    Var($\Delta P$) Pa: 10
Average Hot Air Recirculation $\Delta A_{Circ}$ %: 30    Var($\Delta A_{Circ}$): 15
Average Cold Air Bypass $\Delta A_{Bypass}$ %: 30    Var($\Delta A_{Bypass}$): 15
Average Heat Load Airflow $V_{Equip}$ cfm: 1500    Var($V_{Equip}$): 300

Humidity Management
Average Cold Intake Humidity $h_{Rel}$ %: 50    Var($h_{Rel}$) %: 10
Average Cold Intake Dew Point Temperature $t_{Dew}$ °F: 50    Var($t_{Dew}$) °F: 10

Overall Indices

Overall Rack Cooling Effectiveness:    $RCI_{Hi} = 90\%*$    $RCI_{Lo} = 50\%*$
Overall Rack Humidity Effectiveness:    $RHI_{Hi} = 91\%*$    $RHI_{Lo} = 93\%*$
Overall Rack Airflow Effectiveness:    $RAI_{Hi} = 90\%*$    $RAI_{Lo} = 50\%*$
Overall Rack Pressure Effectiveness:    $RPI_{Hi} = 90\%*$    $RPI_{Lo} = 50\%*$
Overall Air Management Performance:    $RTI = 50\%$

Energy Saving Estimates
Fan Energy Saving:    Potential = 87%
Chiller Energy Saving:    Potential = 70%    Aggressive = 50%

Fig. 6

SYSTEM AND METHOD OF SAFE AND EFFECTIVE ENERGY USAGE AND CONSERVATION FOR DATA CENTERS WITH RACK POWER DISTRIBUTION UNITS

BACKGROUND OF THE INVENTION

1. Field of the Invention

This invention relates to data center energy usage and conservation management, and in particular, it relates to system and method for improving energy usage and conservation of air-management units in a data center utilizing a multiplicity of rack mounted power distribution units.

2. Description of the Related Art

Data centers are widely used in computer, networking and telecommunication and other related industries. A typical data center has one or more computer rooms where multiple racks are installed. Multiple electronic devices/appliances, computers/servers, networking and/or telecommunication equipment (collectively "electronic devices") are mounted on each rack. Electrical powers to these electronic devices are provided through rack power distribution units ("rPDUs"). An rPDU is a rack-mount or rack-based device typically having multiple appliance outlets designed to distribute electric power to the multiple electronic devices mounted on the racks located within a data center.

In a typical arrangement, a computer room has a raised floor, upon which a multiplicity of racks are mounted or based. The computer room is often equipped with air conditioning units, commonly known as computer room air conditioners (CRAC) or computer room air handlers (CRAH) units, to control and manage the working environment inside the computer room. The CRAC/CRAH units are designed to achieve and maintain, for example, temperature and humidity levels, both inside the computer room and more importantly within the racks, within certain ranges that are suitable for the operating conditions of the electronic device mounted on the racks.

A typical CRAC/CRAH unit may include a chiller for chilling the air through a refrigerant or coolant and water, a dehumidifier for drying the air, and a fan for blowing the air for circulation. The CRAC/CRAH units can distribute cooling air through air conduits under the raised floor of the computer room, which often has perforated tiles placed in front or beneath the racks to allow the cooling air from the floor to cool the rPDUs mounted on the racks. The cooling air is often also filtrated by the CRAC/CRAH units to reduce the humidity level within the racks.

Some conventional racks for rPDUs are also provided with temperature and/or humidity sensors to monitor the temperature and/or humidity levels within the racks. When the temperature and/or humidity level within the racks reaches certain pre-determined threshold, the cooling and/or dehumidifying parts of the CRAC/CRAH units may be operated to reduce the temperature and/or humidity levels to prevent potential malfunction of the electronic devices mounted on the rack that may be caused by excessive temperature or humidity level inside the racks.

However, it has been a challenge to effectively and efficiently manage the energy usage for providing a suitable working environment inside a computer room. For example, electrical power distribution and usage provided through the rPDUs and by the electronic device mounted on the racks will generate heat inside the racks, so it is necessary to provide and circulate adequate flow of cooling air through the racks so that the electronic devices will not over heat. But cooling and circulating the air flow use energy in the form of electrical power that run the CRAC/CRAH units, and excessive cooling and circulating of the air flow will cause unnecessary energy usage.

Certain indices have been introduced in the industry to describe and measure the airflow and cooling performance of data centers. For example, Rack Cooling Index (RCI®) and Return Temperature Index (RTI®) have been introduced to measure the overall rack cooling effectiveness and the overall rack air-management performance, respectively. It is noted that RCI® and RTI® are registered trademarks of ANCIS Inc.; however for clarity purposes they will be referred to hereinafter as RCI and RTI without the trademark symbol (®).

The RCI index has two parts, $RCI_{Hi}$ and $RCI_{Lo}$, describing respectively the computer room temperature environment at an upper threshold and lower threshold of a safe temperature range. For example, for a rack system arranged in an indoor environment such as a computer room, an industry recommended safe temperature range may be between 18-27° C., and an industry maximum allowable safe temperature range may be between 15-32° C.

The $RCI_{Hi}$ and $RCI_{Lo}$ are defined as follows:

$$RCI_{Hi} = \left(1 - \frac{\text{Total Over-Temp.}}{\text{Max. Allow. Over-Temp.}}\right) \cdot 100\% \quad [1]$$

$$RCI_{Lo} = \left(1 - \frac{\text{Total Under-Temp.}}{\text{Max. Allow. Under-Temp.}}\right) \cdot 100\% \quad [2]$$

Where:
"Total Over-Temp" is the sum of the over-temperatures (over an upper threshold of the safe temperature range) across intakes of all racks;
"Max. Allow. Over-Temp" is the maximum allowable over-temperature for the electronic devices mounted on the rack system to operate safely;
"Total Under-Temp" is the sum of the under-temperatures (below a lower threshold of the safe temperature range) across intakes of all racks; and
"Max. Allow. Under-Temp" is the maximum allowable under-temperature for the electronic devices mounted on the rack system to operate safely.

For a computer room with a total of M number of racks each having N number of rPDUs for providing and distributing electrical power, the $RCI_{Hi}/RCI_{Lo}$ indices may be calculated as follows:

$$RCI_{Hi} = \left[1 - \frac{\sum(t_{ij} - t_{max-rec})}{(t_{max-all} - t_{max-rec}) \cdot M \cdot N}\right] \cdot 100\% \quad [3]$$

$$RCI_{Lo} = \left[1 - \frac{\sum(t_{min-rec} - t_{ij})}{(t_{min-rec} - t_{min-all}) \cdot M \cdot N}\right] \cdot 100\% \quad [4]$$

Where:
i=1, . . . , M (number of racks)
j=1, . . . , N (number of rPDUs in a rack)
$t_{ij}$ is the intake temperature of the $j_{th}$ rPDU in the $i_{th}$ rack;
$t_{max-rec}$ is the maximum recommended intake temperature (e.g., 27° C.);
$t_{max-all}$ is the maximum allowed intake temperature (e.g., 32° C.);

$t_{min-rec}$ is the minimum recommended intake temperature (e.g., 18° C.); and $t_{min-all}$ is the minimum allowed intake temperature (e.g., 15° C.).

The RTI index is defined as follows:

$$RTI = \frac{[T_{Return} - T_{Supply}]}{\Delta T_{Equip}} \cdot 100\% \quad [5]$$

Where:

$T_{Return}$ is the temperature of the return airflow;

$T_{Supply}$ is the temperature of the supply airflow; and $\Delta T_{Equip}$ is the temperature rise across the rack.

These indices are not completely independent of one another, reflecting the challenge of improving both the effectiveness and the efficiency of the energy management system. For example, reducing air temperature and increasing airflow in a rack will increase the rack cooling effectiveness and therefore improve the RCI, but it will also increase energy usage for cooling the rack and therefore reduce the overall rack air-management performance, resulting in a poor RTI.

One of the results of a poor rack air-management performance is low energy efficiency. For a computer room, the total power consumption is the sum of the electrical power distributed to the electronic devices by all of the rPDUs mounted on the racks in the computer room and the electrical power used by its CRAC/CRAH unit in air-management, and the energy efficiency may be calculated as $$\text{Energy Efficiency} = \frac{\text{Power distributed by all } rPDUs}{\text{Total power consumption of the Computer Room}} \quad [6]$$

There are still shortcomings existed in conventional power and energy management systems that affect the energy efficiency of the computer rooms. Operators and/or managers of conventional power and energy management systems who are in charge of providing and maintaining a suitable working environment in a data center often face a series of questions related to the control and operation of the CRAC/CRAH units, such as:

Is the chiller of the CRAC/CRAH unit cooling the air circulation effectively? Is there a need to reduce the air temperature? Is the electronic device in the racks safe at the current temperature?

Is the dehumidifier of CRAC/CRAH unit maintaining the humidity level inside the racks effectively? Is there a need to reduce or increase the humidity level? Is the rPDUs in the racks safe at the current humidity level?

Is the fan of the CRAC/CRAH unit circulating air inside the racks effectively? Is there a need to raise the fan speed to increase the airflow?

Is the CRAC/CRAH unit working efficiently? Are there ways to improve the overall air-management performance to improve the energy efficiency? What is the expected energy saving?

The answers to these critical questions directly affect not only the effectiveness of the control and operation of the CRAC/CRAH units for the well-being and safety of the electronic devices in a data center, but also the efficiency of the energy usage and conservation for the overall air-management performance. Yet existing conventional power and energy management systems do not provide sufficient and effective tools and procedures for the operators and/or managers of the system to answer these questions in real-time and to find and provide adequate solutions to the challenging objectives.

Therefore it is desirable to provide a new and improved system and method to safely and effectively use and save energy for data centers using rPDUs.

SUMMARY OF THE INVENTION

The present invention provides a system and method of safe and effective energy usage and conservation for data centers using rack-mounted or rack-based power distribution units (rPDUs).

An object of the present invention is to provide a system and method to achieve an optimal energy efficiency in a data center air-management where multiplicity of rPDUs are used for power distribution to electronic devices mounted on a plurality of racks located in one or more computer rooms of the data center.

To achieve these and/or other objects, as embodied and broadly described, the present invention provides a system for improving energy usage and conservation of at least one air-management unit in a data center where a multiplicity of rPUDs are used for power distribution to a multiplicity of electronic devices mounted on a plurality of racks in at least one computer room of the data center, the plurality of racks are based on a raised floor of the at least one computer room, the raised floor contains air conduit for circulating air conditioned by and supplied from the at least one air-management unit to the plurality of racks to ensure a safe operating environment for the multiplicity of electronic devices. The present invention system includes a group of sensors including power load sensors, temperature sensors, humidity sensors, and differential pressure sensors for sensing power load, temperature, humidity and differential pressures throughout the plurality of racks. The group of sensors are coupled to a computer through a network interface, where the computer automatically receives data from the group of sensors and calculates multiple indices reflecting the operation effectiveness and energy efficiency of the air-management unit, including a rack cooling index RCI, a rack humidity index RHI, a rack airflow index RAI, a rack differential pressure index RPI and a return temperature index RTI, such that the operation of the air-management unit can be adjusted accordingly to achieve an optimal efficiency of safe energy usage and conservation. The present invention system further includes a microprocessor unit for each power distribution unit for processing data from at least one sensor and sending the data to the computer via the network interface, and at least one sensor circuit (e.g., an amplitude and/or voltage sensor circuit) for assisting the processing of data from the at least one sensor.

In another aspect, the present invention also provides a rack mounted power distribution unit (rPDU) coupled to a group of sensors and situated in a data center that has a computer for air-management of the data center. The rPDU includes a microprocessor coupled to the group of sensors for automatically processing data from the sensors, where the group of sensors includes at least one differential pressure sensor. The microprocessor sends the data from the sensors to the computer via a network interface for analyzing the operation effectiveness and energy efficiency of the air-management of the power distribution units. The rPDU also includes at least one sensor circuit coupled to the microprocessor for assisting the processing of data from the group of sensors.

The present invention further provides a method for improving energy usage and conservation of at least one air-management unit in a data center where a multiplicity of rPDUs are used for power distribution to a multiplicity of electronic devices mounted on a plurality of racks in at least one computer room of the data center, the plurality of racks are based on a raised floor of the at least one computer room, the raised floor contains air conduit for circulating air conditioned by and supplied from the at least one air-management unit to the plurality of racks to ensure a safe operating environment for the multiplicity of electronic devices. The present invention method includes the steps of providing a group of sensors including power load sensors, temperature sensors, humidity sensors, and differential pressure sensors for sensing power load, temperature, humidity and differential pressures throughout the plurality of racks; coupling a computer to the group of sensors through a network interface for automatically receiving data from the group of sensors; and calculating multiple indices reflecting the operation effectiveness and energy efficiency of the air-management unit, including a rack cooling index RCI, a rack humidity index RHI, a rack airflow index RAI, a rack differential pressure index RPI and a return temperature index RTI based on the data from the group of sensors to achieve an optimal efficiency of safe energy usage and conservation. The present invention method further includes the steps of making operational adjustment to the air-management unit and to recalculate the multiple indices, and repeating the adjustment step until the recalculated values of the multiple indices are all above 95%.

To make the above described invention easier to understand, a preferred embodiment is described below in detail, in conjunction with the appended drawings.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

FIG. 6 is an exemplary screen display of the energy usage and conservation program according to the preferred embodiment of the present invention, illustrating vital data and indices of the rPDU rack system calculated by the control computer.

DETAILED DESCRIPTION OF THE PREFERRED EMBODIMENTS

As required, a detailed illustrative embodiment of the present invention is disclosed herein. However, techniques, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein, which define the scope of the present invention. The following presents a detailed description of the preferred embodiment (as well as some alternative embodiments) of the present invention.

Figure 1:
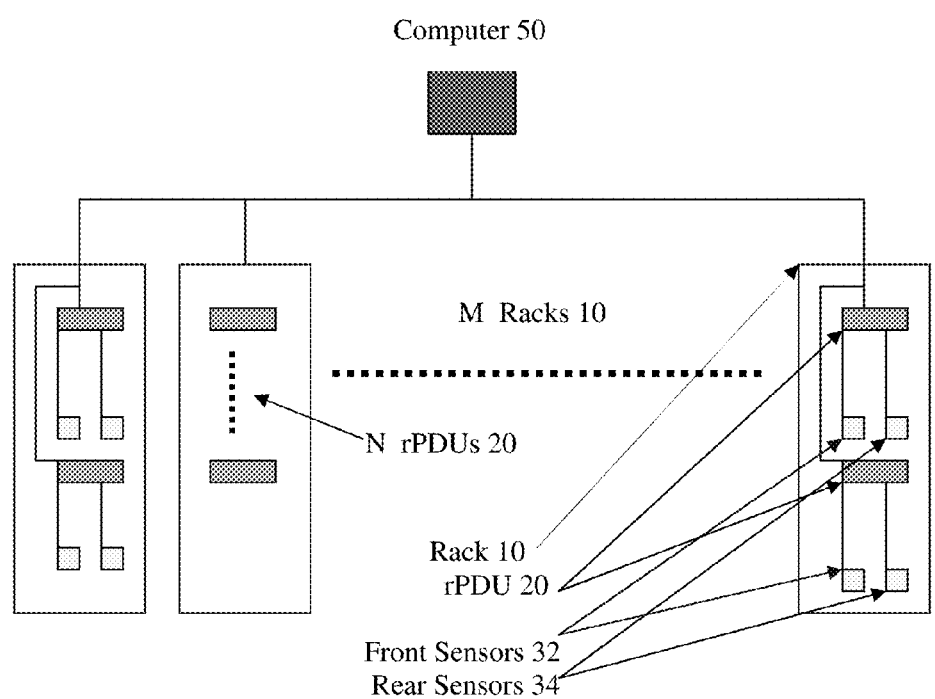
FIG. 1 is a block diagram illustrating a system arrangement of energy usage and conservation according to a preferred embodiment of the present invention.

The present invention is directed to a system and method of energy usage and conservation management for data centers utilizing rack power distribution units (rPDUs). Referring to FIG. 1, there is shown a system arrangement and configuration for energy usage and conservation according to a preferred embodiment of the present invention. The present invention system includes a multiplicity of racks 10 positioned on a mounted floor (not shown) inside a computer room of a data center. A multiplicity of rPDUs 20 are used for distributing electrical power to electronic devices mounted on each rack 10 in the data center, such as servers, data storage, networking and/or telecommunication units, etc. . . . A multiplicity of front sensors 32 and rear sensors 34 are provided in each rack 10 and preferably for each rPDU 20.

Figure 2A:
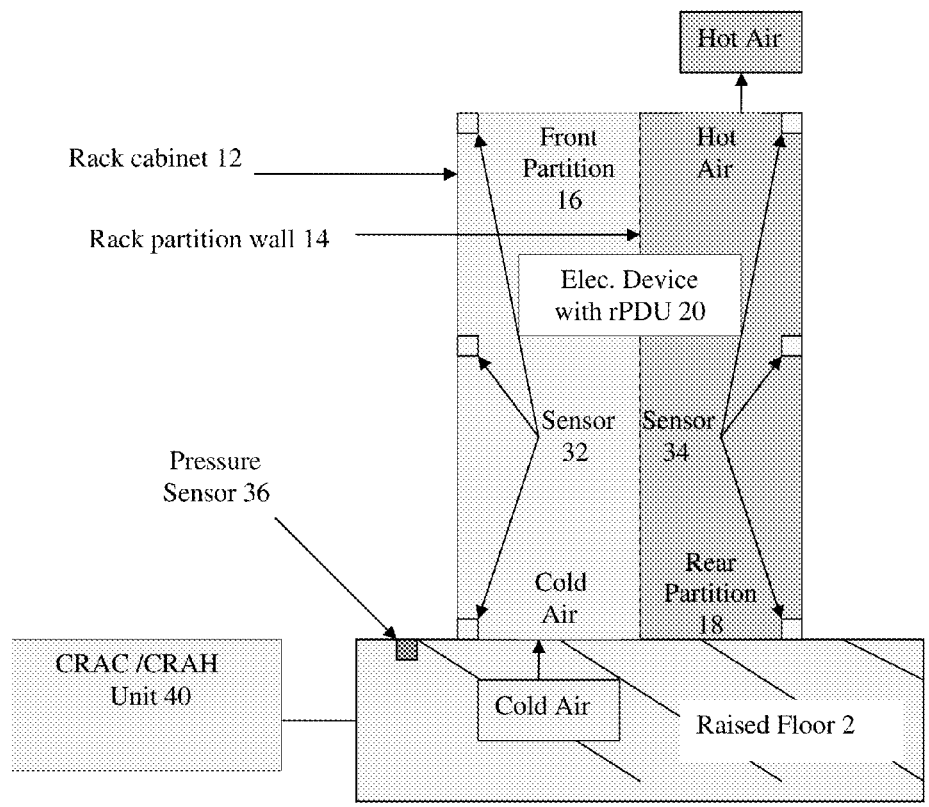
FIG. 2(a) is a side-view diagram illustrating the locations of the sensors for an rPDU rack system according to the preferred embodiment of the present invention.
Figure 2B:
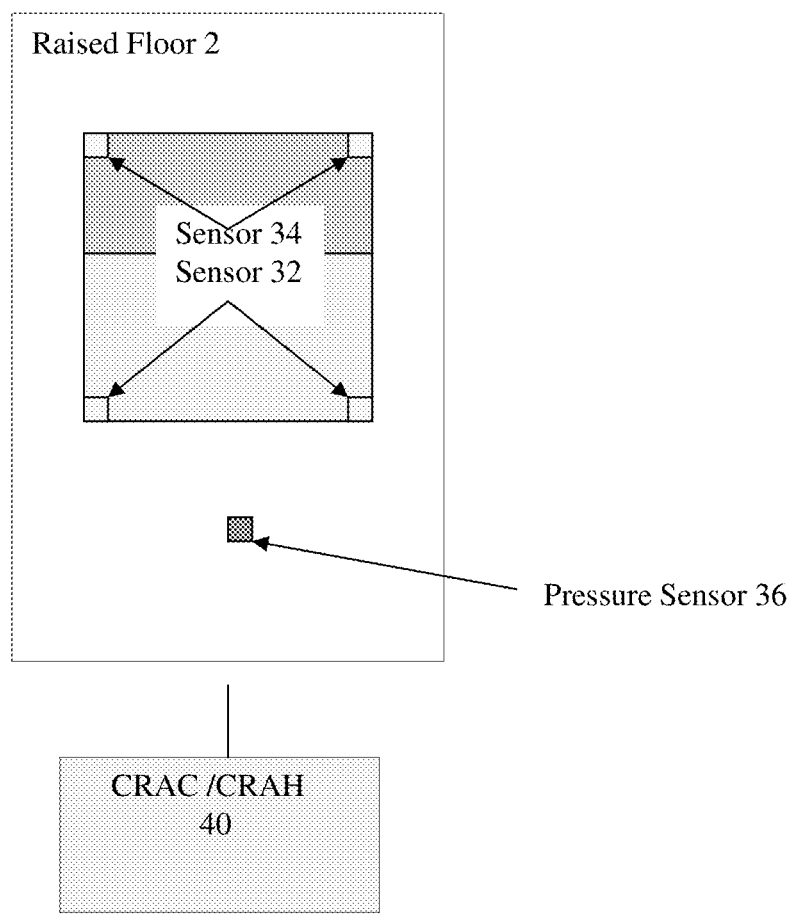
FIG. 2(b) is a top-view diagram illustrating the locations of the sensors for the rPDU rack system according to the preferred embodiment of the present invention.

Referring to FIGS. 2(a) and 2(b), there is shown a raised floor 2 upon which the multiplicity of racks 10 are mounted or installed. Each rack 10 has a closed cabinet 12 with an internal partition wall 14 which divides the internal cabinet space into a front partition 16 and a rear partition 18. The electronic devices connected to rPDUs 20 are typically mounted horizontally on the rack 10 (one is shown for clarity purpose) such that their front ends are located within the front partition 16 and their back ends are located within the rear partition 18. Cold air supplied by a computer room air conditioner (CRAC) or computer room air handler (CRAH) unit 40 is supplied through the raised floor 2 into the front partition 16 of the cabinet 12 of each rack 10, and passing through the electronic devices into the rear partition 18 of the cabinet 12 of the rack 10.

Air circulation passes through each electronic devices by entering from internal fan or air intake openings at the front end of the electronic devices located in the front partition 16 of the rack cabinet 12 and exiting from internal fan or air exhaust openings at the back end of the electronic devices located within the rear partition 18 of the rack cabinet 12, and while passing through the electronic devices the airflow absorb the heat generated within the electronic devices and becoming warm or hot air. The hot air in the rear partition 18 of the rack cabinet 12 is circulated out typically through air conduits in the ceiling of the computer room (not shown) and returned to the CRAC/CRAH unit 40.

The front sensors 32 are positioned inside the front partition 16 of the rack cabinet 12, and the rear sensors 34 are positioned inside the rear partition 18 of the rack cabinet 18. They are evenly distributed and preferably matching the height/locations of the electronic devices. The front and rear sensors may include electrical power sensors, temperature sensors, humidity sensors or both, for monitoring the power usage, temperature and/or humidity levels inside the cabinet 12 of the racks 10. One or more differential pressure sensors 36 are also provided to monitor the pressure change in the raised floor 2. They are preferably located in front of each rack 10.

Figure 3:
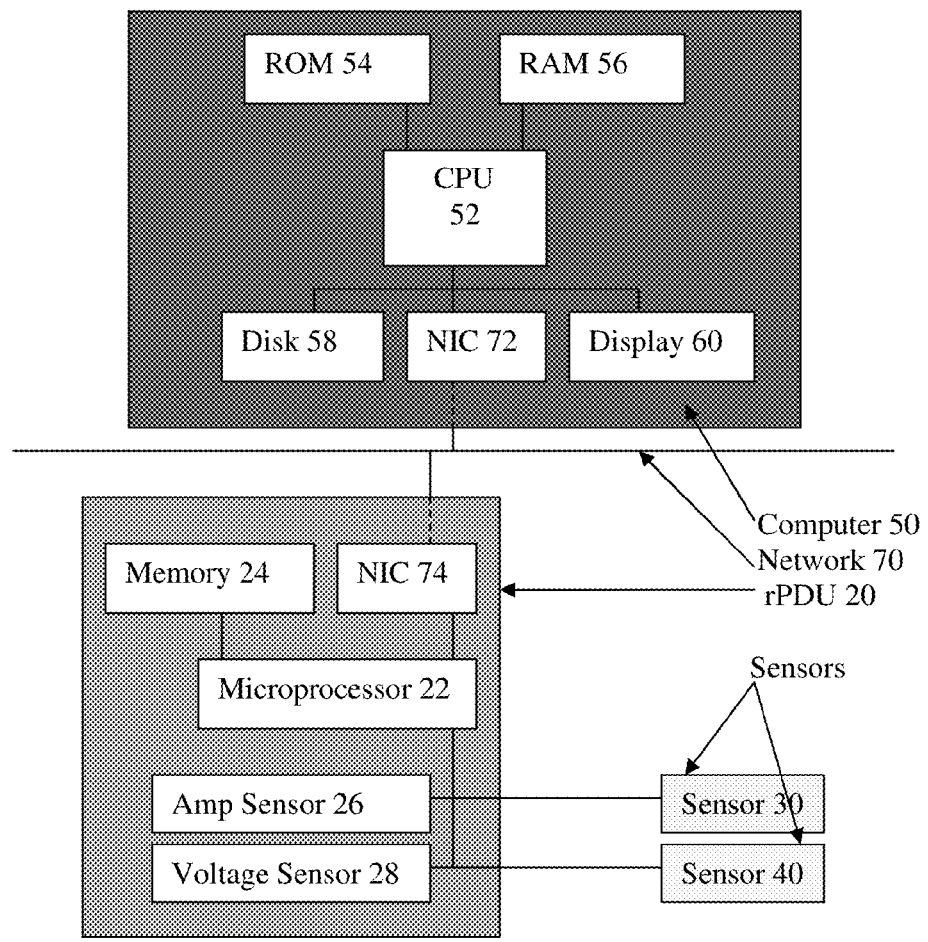
FIG. 3 is a block diagram illustrating the internal components of an energy usage and conservation system according to the preferred embodiment of the present invention.

The present invention also includes a computer 50 for controlling and operating the rPDU energy usage and conservation system. Referring to FIG. 3, the computer 50 includes a central processor unit (CPU) 52 that controls the function and operation of the computer 50 and execute computer instructions and programs that may be installed or saved on a read only memory (ROM) 54, a random access memory (RAM) 56, or a data storage unit such as a hard disc drive 58 coupled to the CPU 52. The computer 50 also includes a display 60 for displaying the control, operation and status of the system. Display 60 may have a touch screen for inputting command and instructions by an operator. In addition or alternatively the computer 50 may have other input devices such as a keyboard and a mouse (not shown).

The rPDU 20 also includes microprocessor 22 coupled to a memory 24 which may contain internal commands and instructions to be executed by the microprocessor 22. Front and rear sensors 32 and 34 and pressure sensors 36 (not shown) are electrically coupled to the microprocessor 22 and amplitude sensor circuit 26 and voltage sensor circuit 28 for processing sensor signals.

Computer 50 and rPDU 20 may be connected through a network channel 70 via a network interface card (NIC) 72 of the computer 50 and another NIC 74 of the rPDU 20. It is understood that other types of sensors, such as airflow and humidity sensors, may be used together or independently with the temperature and pressure sensors. It is also understood that computer 50 may be any suitable computer or server or any suitable data processing apparatus or devices or units, and the network 70 may be any suitable wired or wireless network.

The present invention provides a method for managing the energy usage and conservation of one or more computer rooms of a data center by executing a computer software program installed on the computer 50. When a data center or computer room manager/operator executes the software program of the present invention, the computer 50 carries out various respective functions of the software to perform various steps of the present invention process, and cause the performance and completion of the present invention progress as more fully described below.

Figure 4:
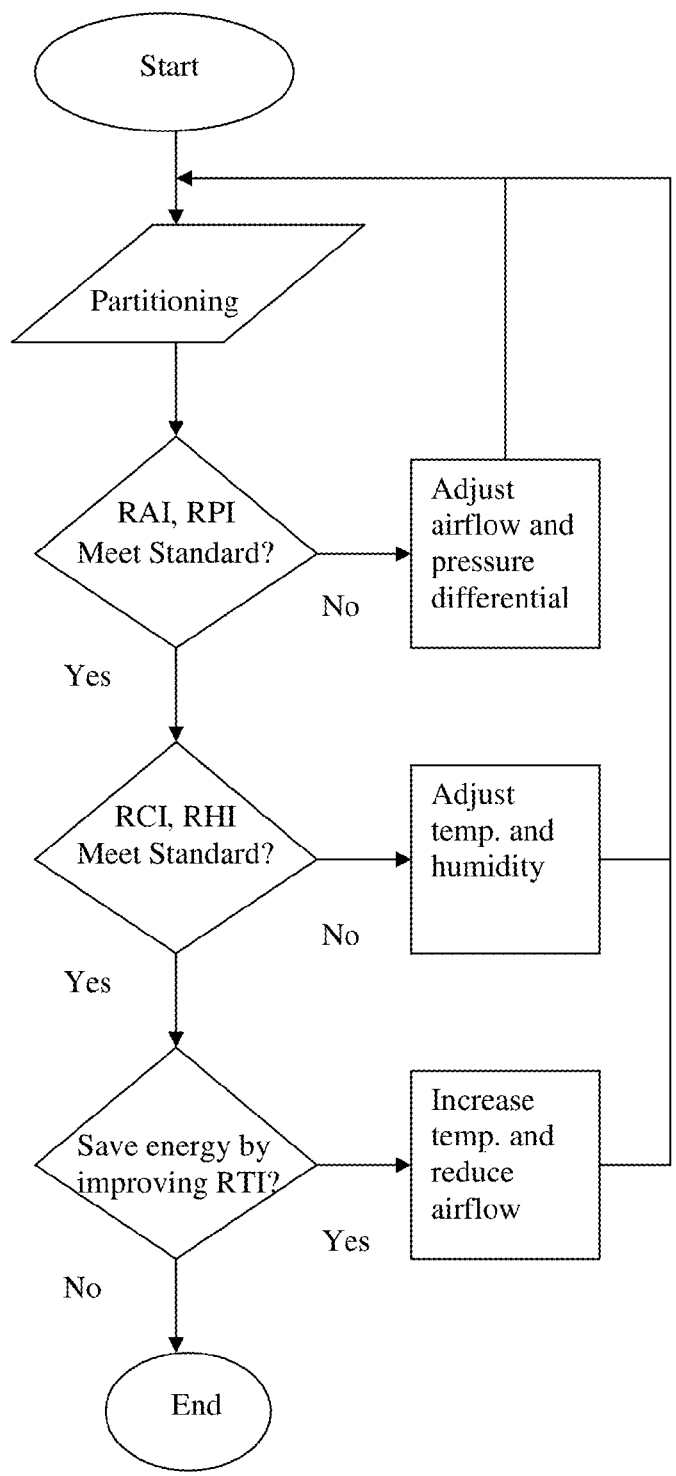
FIG. 4 is a block flowchart diagram illustrating a method for implementing the energy usage and conservation program according to the preferred embodiment of the present invention.

Referring to FIG. 4, there is shown a flowchart illustrating the process for implementing an energy usage and conservation method according to the preferred embodiment of the present invention. After partitioning the rack cabinets and placing the sensors as described above, the present invention program calculates a Rack Airflow Index (RAI) and a Rack (differential) Pressure Index (RPI) based on sensor inputs and check to see whether they meet predetermined thresholds or standards.

The RAI index has two parts, $RAT_{Hi}$ and $RAI_{Lo}$, describing respectively the airflow at an upper threshold and a lower threshold of a safe airflow range.

The $RAT_{Hi}$ and $RAI_{Lo}$ are defined as follows:

$$RAI_{Hi} = \left(1 - \frac{\text{Total Overflow}}{\text{Max. Allowable Overflow}}\right) \cdot 100\% \quad [7]$$

$$RAI_{Lo} = \left(1 - \frac{\text{Total Underflow}}{\text{Max. Allowable Underflow}}\right) \cdot 100\% \quad [8]$$

Wherein:
"Total Overflow" is the sum of overflow across all racks;
"Max. Allow. Overflow" is the maximum allowable overflow for the electronic devices in the rPDU rack system to operate safely;
"Total Underflow" is the sum of underflow across all racks; and
"Max. Allow. Underflow" is the maximum allowable underflow for the electronic devices in the rPDU rack system to operate safely.

For a computer room with a total of M number of racks each having N number of rPDUs, the $RAI_{Hi}/RAI_{Lo}$ indices may be calculated as follows:

$$RAI_{Hi} = \left[1 - \frac{\sum(Q_{Floor-i} - V_{max-rec-i})}{(V_{max-all-i} - V_{max-rec-i}) \cdot M}\right] \cdot 100\% \quad [9]$$

$$RAI_{Lo} = \left[1 - \frac{\sum(V_{min-rec-i} - Q_{Floor-i})}{(V_{min-rec-i} - V_{max-all-i}) \cdot M}\right] \cdot 100\% \quad [10]$$

Where:
$Q_{Floor-i}$ is the airflow in the raised floor under the $i_{th}$ rack;
$V_{max-rec-i}$ is the maximum recommended airflow for the $i_{th}$ rack;
$V_{max-all-i}$ is the maximum allowed airflow for the $i_{th}$ rack;
$V_{min-rec-i}$ is the minimum recommended airflow for the $i_{th}$ rack; and
$V_{min-all-i}$ is the minimum allowed airflow for the $i_{th}$ rack.

As an example, if the airflow across all rPDUs in the $i_{th}$ rack is $V_{Equip-i}$, then the recommended and allowable maximums and minimums of the airflow may be:

$V_{max-rec-i} = V_{Equip-i} \times 115\%$ $V_{max-all-i} = V_{Equip-i} \times 130\%$ $V_{min-rec-i} = V_{Equip-i} \times 85\%$ $V_{min-all-i} = V_{Equip-i} \times 70\%$ The RPI index has two parts, $RPI_{Hi}$ and $RPI_{Lo}$, describing respectively the airflow at an upper threshold and a lower threshold of a safe airflow range.

The $RPI_{Hi}$ and $RPI_{Lo}$ are defined as follows:

$$RPI_{Hi} = \left[1 - \frac{\sum(\Delta P_{min-rec} - \Delta P_i)}{[(\Delta P_{max-rec} - \Delta P_{min-rec})/2] \cdot M \cdot N}\right] \cdot 100\% \quad [11]$$

$$RPI_{Lo} = \left[1 - \frac{\sum(\Delta P_i - \Delta P_{max-rec})}{[(\Delta P_{max-rec} - \Delta P_{min-rec})/2] \cdot M \cdot N}\right] \cdot 100\% \quad [12]$$

Where:
$\Delta P_i$ is the differential pressure in the raised floor under the $i_{th}$ rack;
$\Delta P_{max-rec}$ is the maximum recommended differential pressure;
$\Delta P_{max-all}$ is the maximum allowed differential pressure;
$\Delta P_{min-rec}$ is the minimum recommended differential pressure; and
$\Delta P_{min-all}$ is the minimum allowed differential pressure.

If the predetermined thresholds for RAI or RPI is not met, then the program will cause the adjustment of airflow or pressure differential or both of the cooling air, until they meet the thresholds. This step addresses the issues concerning efficiency of the cooling airflow by the fans and chillers of the CRAC/CRAH units. Are the fans supplying adequate airflow to the rack systems? Is there a need to raise the speed of the fans to increase airflow? Are the electronic devices safe under the current airflow? The airflow through the electronic devices in the rack system cannot be too high or too low.

The RAI is used to indicate whether the airflow is matching the safe operation of the electronic devices mounted on the rack system. The temperature and pressure sensors sense the temperatures and pressure differentials of the intake and exhaust airflows and send their signals to the system control computer through the rPDUs. The program then calculates the actual intake and exhaust airflows based on the power load of each rack, and ranks the airflows of the racks accordingly. The differences between the excessive rack airflows and the upper threshold and between the insufficient rack airflows and the lower threshold will be added and compared with the sum of high and low airflow threshold differences of all racks. This will provide an indication on the airflow efficiency of the CARC/CRAH units.

When it is necessary to increase or decrease the fan speed to adjust the environment of the rack system, the computer will calculate the RAI to see whether it is within a suitable range. If the RAI is out of the normal range, then the CRAC/CRAH unit will stop increasing or decreasing the fan speed so that the electronic devices in the rack system can operate safely.

In the next step the program will calculate the Rack Cooling Index (RCI) and a Rack Humidity Index (RHI) based on sensor inputs and check to see whether they meet predetermined thresholds or standards. The $RCI_{Hi}/RCI_{Lo}$ indices provide a measure of over or under temperature occurrences. When $RCI_{Hi}/RCI_{Lo}$ approaches 100%, it means that there is minimum or no over/under temperature occurrence in the rack system, which ensures that the electronic devices in the rack system are working in the safe temperature range. If the $RCI_{Hi}/RCI_{Lo}$ indices are outside the threshold range, then the control program will cause the adjustment of temperature level of the cooling air, until they meet the thresholds.

This step addresses the issues concerning of cooling efficiency of the CRAC/CRAH units. Are the airflow cold enough for the electronic devices in the racks? Is there a need to reduce the temperature of the airflow? Are the electronic devices safe under the current temperature? The temperature of the electronic devices in the rack system cannot be too high or too low.

The $RCI_{Hi}/RCI_{Lo}$ indices are used to indicate whether the temperature is within the safe operation range of the electronic devices. The temperature sensors sense the temperatures of the intake and exhaust airflows and send their signals to the system control computer through the rPDUs. The program then ranks the temperatures of the racks accordingly. The differences between the high rack temperatures and the upper threshold and between the lower rack temperatures and the lower threshold will be added and compared with the sum of high and low temperature threshold differences of all racks. This will provide an indication on the rack system cooling efficiency of the CARC/CRAH units.

When it is necessary to increase or decrease the temperature of the cooling airflow to adjust the environment of the rack system, the computer will calculate the $RCI_{Hi}$ and $RCI_{Lo}$ to see whether they are within a suitable range. If the $RCI_{Hi}$ or $RCI_{Lo}$ is out of the normal range, then the CRAC/CRAH unit will stop increasing or decreasing the temperature so that the electronic devices can operate safely.

The applicant has also introduced the RHI to describe the computer room humidity environment with respect to a safe humidity range. The RHI has two parts, $RHI_{Hi}$ and $RHI_{Lo}$, describing respectively the computer room humidity environment at an upper threshold and lower threshold of a safe humidity range.

The $RHI_{Hi}$ and $RHI_{Lo}$ are defined as follows:

$$RHI_{Hi} = \left[1 - \left(\frac{\text{Total Over-}RH}{\text{Max. Over-}RH/2} + \frac{\text{Total Over-}DP}{\text{Max. Over-}DP/2}\right)\right] \cdot 100\% \quad [13]$$

$$RHI_{Lo} = \left[1 - \frac{\text{Total Under-}DP}{\text{Min. Under-}DP/2}\right] \cdot 100\% \quad [14]$$

Wherein:
"Total Over-RH" is the number of occurrences that the rack humidity is over the upper threshold of the safe humidity range;
"Max. Allow. Over-RH" is the maximum allowable number of occurrences that the rack humidity is over the upper threshold of the safe humidity range for the electronic devices in the rPDU rack system to operate safely;
"Total Over-DP" is the number of occurrences that the differential pressure is over the upper threshold of a safe differential pressure range;
"Max. Allow. Over-DP" is the maximum allowable number of occurrences that the differential pressure is over the upper threshold of the safe pressure differential range for the electronic devices in the rPDU rack system to operate safely;
"Total Under-DP" is the number of occurrences that the differential pressure is under the lower threshold of a safe differential pressure range; and
"Min. Allow. Under-DP" is the minimum allowable number of occurrences that the differential pressure is under the lower threshold of the safe pressure differential range for the electronic devices in the rPDU rack system to operate safely.

For a computer room with a total of M number of racks each having N number of rPDUs, the $RHI_{Hi}/RHI_{Lo}$ indices may be calculated as follows:

$$RHI_{Hi} = \left\{1 - \left[\frac{\sum(T_{Dew\text{-}ij} - T_{Dew\text{-}max\text{-}rec})}{[(T_{Dew\text{-}max\text{-}rec} - T_{Dew\text{-}min\text{-}rec})/2] \cdot M \cdot N} + \frac{\sum(H_{ij} - H_{max\text{-}rec})}{(H_{max\text{-}rec}/2) \cdot M \cdot N}\right]\right\} \cdot 100\% \quad [15]$$

$$RHI_{Lo} = \left\{1 - \left[\frac{\sum(T_{Dew\text{-}min\text{-}rec} - T_{Dew\text{-}ij})}{[(T_{Dew\text{-}max\text{-}rec} - T_{Dew\text{-}min\text{-}rec})/2] \cdot M \cdot N}\right]\right\} \cdot 100\% \quad [16]$$

Where:
$T_{Dew\text{-}ij}$ is the dew-point temperature of the jth rPDU in the $i_{th}$ rack;
$T_{Dew\text{-}max\text{-}rec}$ is the maximum recommended dew-point temperature;
$T_{Dew\text{-}min\text{-}rec}$ is the minimum recommended dew-point temperature;
$H_{ij}$ is the humidity of the $j_{th}$ rPDU in the $i_{th}$ rack; and
$H_{max\text{-}rec}$ is the maximum recommended humidity.

The $RHI_{Hi}/RHI_{Lo}$ indices are introduced to provide a measure of over or under humidity and differential pressure occurrences. When $RHI_{Hi}/RHI_{Lo}$ approaches 100%, it means that there is minimum or no over/under humidity occurrence in the rack system, which ensures that the electronic devices are working in a safe humidity range. If $RHI_{Hi}/RHI_{Lo}$ indices are outside the threshold range, then the control program will cause the adjustment of humidity level of the cooling air, until they meet the thresholds.

Therefore this step also addresses the issues concerning of humidification efficiency of the CRAC/CRAH units. Are the airflow dry enough for the electronic devices? Is there a need to humidify or dehumidify the airflow? Are the electronic devices safe under the current humidity? The humidity of the electronic devices in the rack system cannot be too high or too low.

The $RHI_{Hi}/RHI_{Lo}$ indices are used to indicate whether the humidity is within the safe operation range of the electronic devices. The humidity sensors sense the humidity in the rack system and send their signals to the system control computer through the rPDUs. The program then ranks the humidity of the racks accordingly. The differences between the high rack humidity levels and the upper threshold and between the lower rack humidity levels and the lower threshold will be added and compared with the sum of high and low humidity threshold differences of all racks. This will provide an indication on the rPDU humidification efficiency of the CARC/CRAH units.

When it is necessary to increase or decrease the temperature of the cooling airflow to adjust the environment of the rack system, the computer will calculate the $RCI_{Hi}$ and $RCI_{Lo}$ to see whether they are within a suitable range. If the $RCI_{Hi}$ or $RCI_{Lo}$ is out of the normal range, then the CRAC/CRAH unit will stop increasing or decreasing the temperature so that the electronic devices can operate safely.

Finally, the control program will calculate the Return Temperature Index (RTI) to see whether more energy may be saved by improving the RTI. If so the program will cause the increase of the temperature and decrease of the airflow of the cooling air, which will result in saving of electrical power usage of the CRAC/CRAH units, which in turn increases the energy conservation of the overall system performance of the present invention.

This step addresses the issues concerning of overall air-management efficiency of the system. What is the measure of overall air-management efficiency? If the efficiency is not maximized, what is the problem and how to correct it? Is there room for improvement? What is the expected saving of overall energy usage? The RTI is used to indicate the overall energy efficiency of the entire system.

When RTI is over 100%, it is an indication of recirculation of hot air. When RTI is less then 100%, it is an indication of by-pass of cooling air. Therefore, from the calculation of RTI, the problem in the rack system may be quickly identified and rectified. The goal or target is to approach an RTI=100% which indicates an optimized air-management efficiency. With all the signals from the sensors positioned through out the rack system, the control computer can instantaneously calculate the RTI, providing the operator/manager of the computer room or data center a real-time tool to evaluate the efficiency of the CRAC/CRAH units and make necessary adjustments to improve the air-management efficiency. At the same time, the real-time sensor feedback also prevents the "over"-adjustment (e.g., continuously cooling the airflow when the rack temperature is within the working range) to not only ensure safety of the electronic devices but also save energy.

Figure 5:
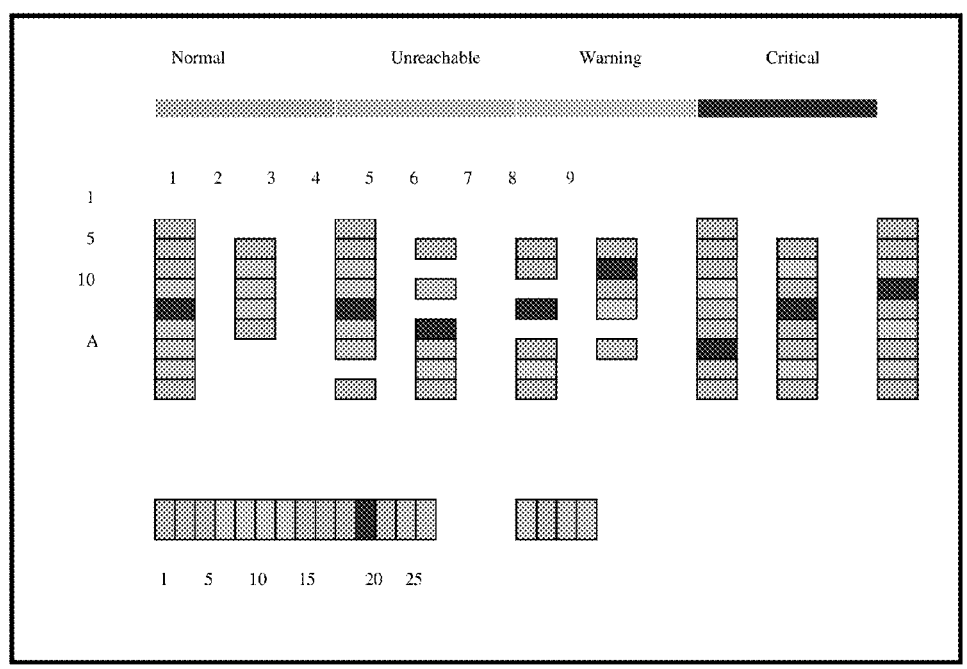
FIG. 5 is an exemplary screen display of the energy usage and conservation program according to the preferred embodiment of the present invention, illustrating the rPDU rack system sensor threshold status.

Referring to FIG. 5, there is shown an exemplary screen display of the energy usage and conservation program according to the preferred embodiment of the present invention, illustrating the rPDU rack system sensor threshold status. The top colored bar indicates various status: green is normal, gray is unreachable, yellow is warning, and red is critical. The icons below represents the sensors in the rPDU rack system as arranged by the rack and rPDU locations. The sensor thresholds for current, voltage, temperature, humidity, pressure differential, etc., are shown by these icons with corresponding colors indicating their status. Using a touch screen display, a tap on an icon will change the display to the status of a particular rPDU and its sensors. Alternatively if a mouse is used as an input device, moving the mouse cursor to an icon will also change the display to the status of the particular rPDU and its sensors.

Referring to FIG. 6, there is shown an exemplary screen display of the energy usage and conservation program according to the preferred embodiment of the present invention, illustrating vital data and indices of the rPDU rack system calculated by the control computer. Such data and indices may include power management data such as the Average Heat Load Density L (kW) and the Average Heat Load Usage U (kWH); thermal management data such as Average Cold Intake Temperature t (° F.), Average Hot Exhaust Temperature T (° F.), Average Intake Differential Temperature $\Delta t$ (° F.), Average Exhaust Differential Temperature $\Delta T$ (° F.) and Average Cold-Hot Temperature Rise $\Delta T_{Equip}$ (° F.); air management data such as Average Differential Pressure $\Delta P$ (Pa), Average Hot Air Recirculation $\Delta A_{Circ}$ (%), Average Cold Air Bypass $\Delta A_{Bypass}$ (%) and Average Heat Load Airflow $V_{Equip}$ (cfm): humidity management data such as Average Cold Intake Humidity $h_{Rel}$ (%) and Average Cold Intake Dew Point Temperature $t_{Dew}$ (° F.); overall indices such as $RCI_{Hi}$ and $RCI_{Lo}$ for Overall Rack Cooling Effectiveness, $RHI_{Hi}$ and $RHI_{Lo}$ for Overall Rack Humidity Effectiveness, $RAI_{Hi}$ and $RAI_{Lo}$ for Overall Rack Airflow Effectiveness, $RPI_{Hi}$ and $RPI_{Lo}$ for Overall Rack Pressure Effectiveness, and RTI for Overall Air Management Performance; and energy saving estimate data for Fan Energy Saving and Chiller Energy Saving. The period for calculating averages may be selected as "Continuous", "Daily", "Weekly", "Monthly" or "Yearly". The general status icons for the management data categories on the left hand side of the display are colored as follows: if any sensor in a category is critical, then the general status icon for that category will be red; if any sensor in a category is warning, then the general status icon for that category will be yellow; and only when all sensors in a category are normal, the general status icon for that category will be green. The general status icons for the indices categories on the left hand side of the display are colored as follows: if any index in a category is poor, then the general status icon for that category will be red; if any index in a category is acceptable, then the general status icon for that category will be yellow; and only when all indices in a category are good, the general status icon for that category will be green. This screen display may be part of the screen display shown in FIG. 5, located adjacent to or below the sensor threshold status icons. Alternatively this screen display may be toggled with the screen display shown in FIG. 5. Using a touch screen display or a mouse cursor to tap, point and/or click on a data or index line will change the display to a display showing details of that data or index item.

Figure 7:
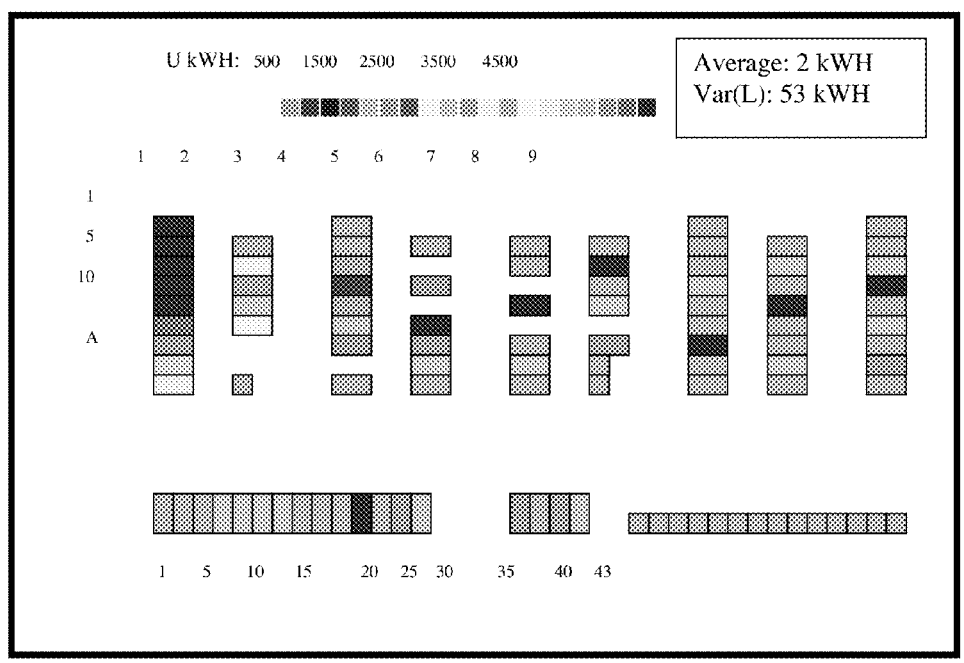
FIG. 7 is an exemplary screen display of the energy usage and conservation program according to the preferred embodiment of the present invention, illustrating the rPDU rack system heat load dissipation status.

Referring to FIG. 7, there is shown an exemplary screen display of the energy usage and conservation program according to the preferred embodiment of the present invention, illustrating the rPDU rack system heat load dissipation status by displaying the value of the Heat Load Usages such as $U_{ij}$ (kWH) which is the load of the $j_{th}$ rPDU in the $i_{th}$ rack.

Figure 8:
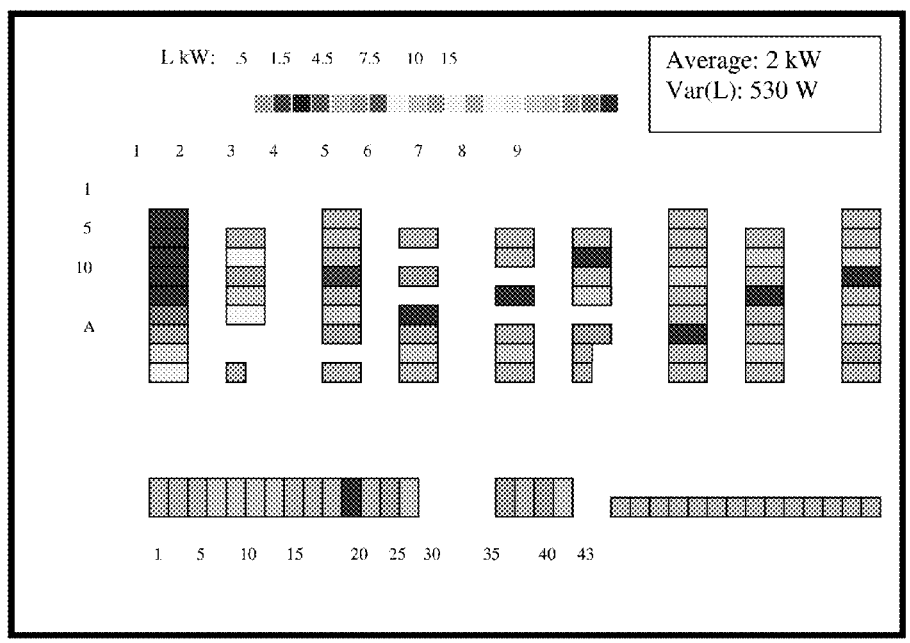
FIG. 8 is an exemplary screen display of the energy usage and conservation program according to the preferred embodiment of the present invention, illustrating the rPDU rack system heat load density status.

Referring to FIG. 8, there is shown an exemplary screen display of the energy usage and conservation program according to the preferred embodiment of the present invention, illustrating the rPDU rack system heat load density status by displaying the value of the Heat Load Densities such as $L_{ij}$ (kW) which is the load density of the $j_{th}$ rPDU in the $i_{th}$ rack.

Figure 9:
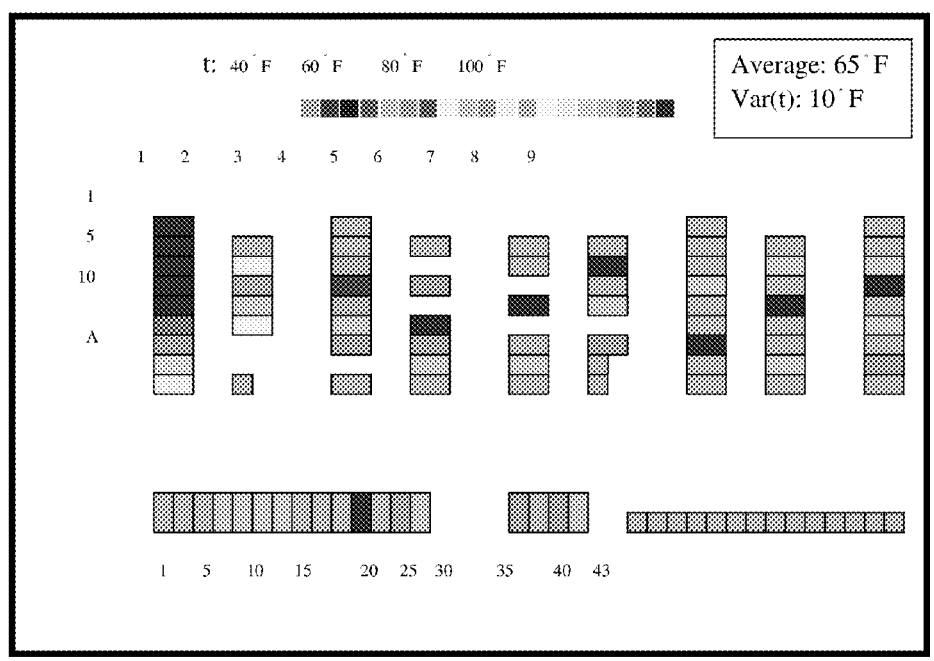
FIG. 9 is an exemplary screen display of the energy usage and conservation program according to the preferred embodiment of the present invention, illustrating the rPDU rack system cold intake temperature status.

Referring to FIG. 9, there is shown an exemplary screen display of the energy usage and conservation program according to the preferred embodiment of the present invention, illustrating the rPDU rack system cold intake temperature status by displaying the value of the Cold Intake Temperatures such as $t_{ij}$ (° F.) which is the cold intake temperature of the $j_{th}$ rPDU in the $i_{th}$ rack.

Figure 10:
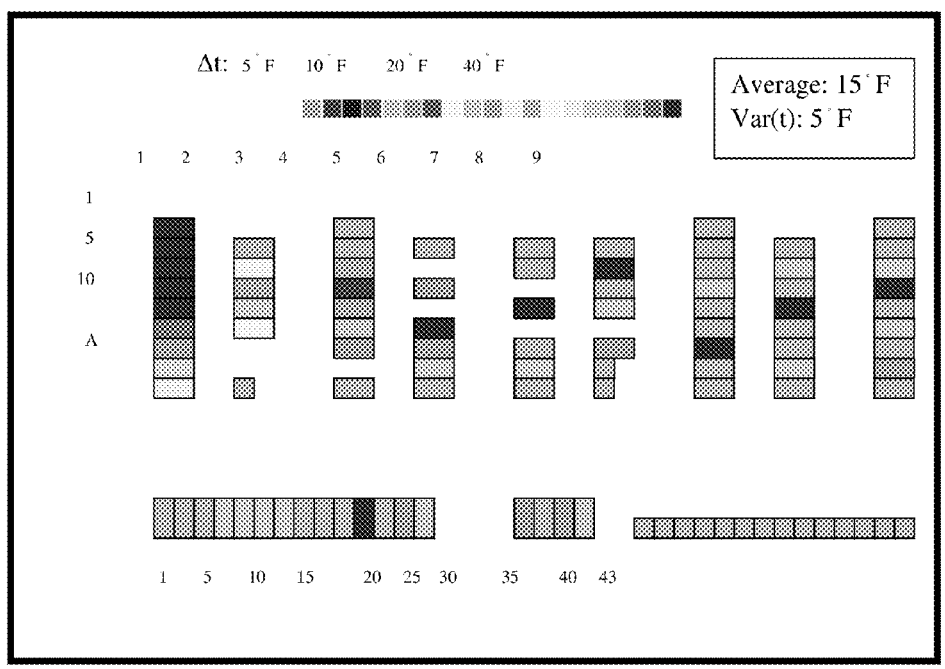
FIG. 10 is an exemplary screen display of the energy usage and conservation program according to the preferred embodiment of the present invention, illustrating the rPDU rack system intake differential temperature status.

Referring to FIG. 10, there is shown an exemplary screen display of the energy usage and conservation program according to the preferred embodiment of the present invention, illustrating the rPDU rack system intake differential temperature status by displaying the value of the Intake Differential Temperatures such as $\Delta t_{ij}$ (° F.) which is the intake differential temperature of the $j_{th}$ rPDU in the $i_{th}$ rack.

Figure 11:
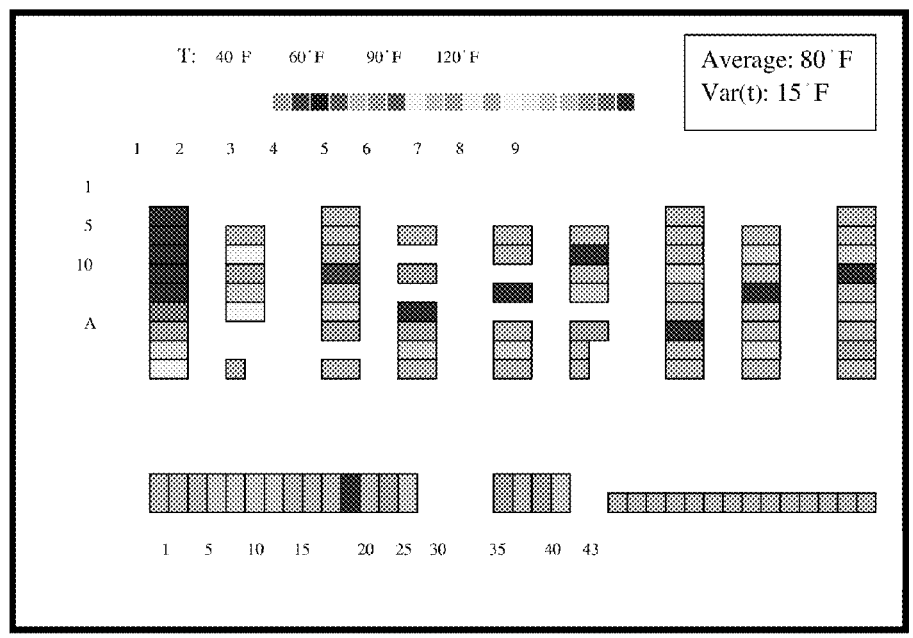
FIG. 11 is an exemplary screen display of the energy usage and conservation program according to the preferred embodiment of the present invention, illustrating the rPDU rack system hot exhaust temperature status.

Referring to FIG. 11, there is shown an exemplary screen display of the energy usage and conservation program according to the preferred embodiment of the present invention, illustrating the rPDU rack system hot exhaust temperature status by displaying the value of the Hot Exhaust Temperatures such as $T_{ij}$ (° F.) which is the hot exhaust temperature of the $j_{th}$ rPDU in the $i_{th}$ rack.

Figure 12:
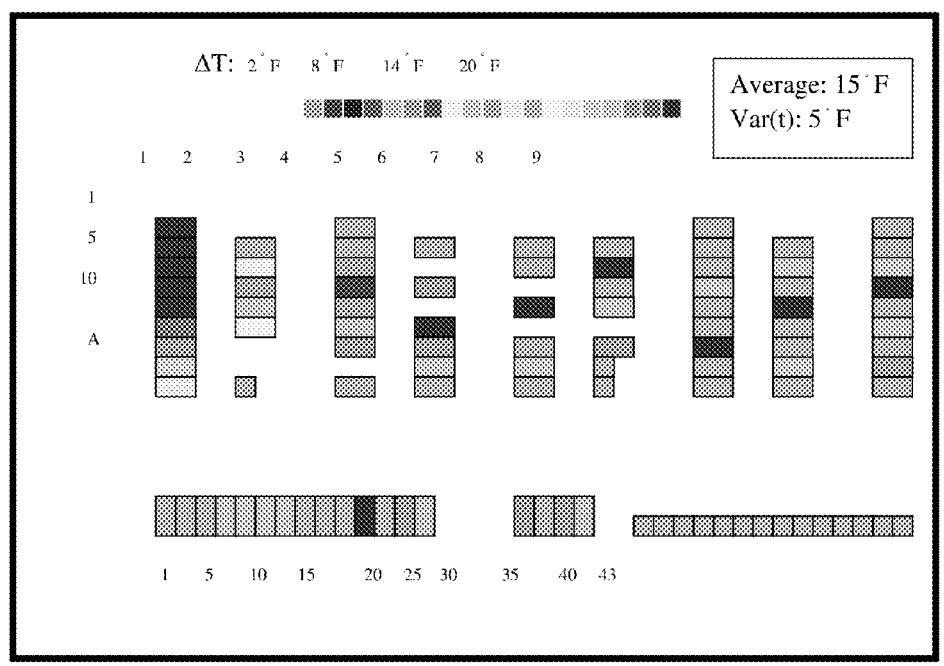
FIG. 12 is an exemplary screen display of the energy usage and conservation program according to the preferred embodiment of the present invention, illustrating the rPDU rack system exhaust differential temperature status.

Referring to FIG. 12, there is shown an exemplary screen display of the energy usage and conservation program according to the preferred embodiment of the present invention, illustrating the rPDU rack system exhaust differential temperature status by displaying the value of the Exhaust Differential Temperatures such as $\Delta T_{ij}$ (° F.) which is the exhaust differential temperature of the $j_{th}$ rPDU in the $i_{th}$ rack.

Figure 13:
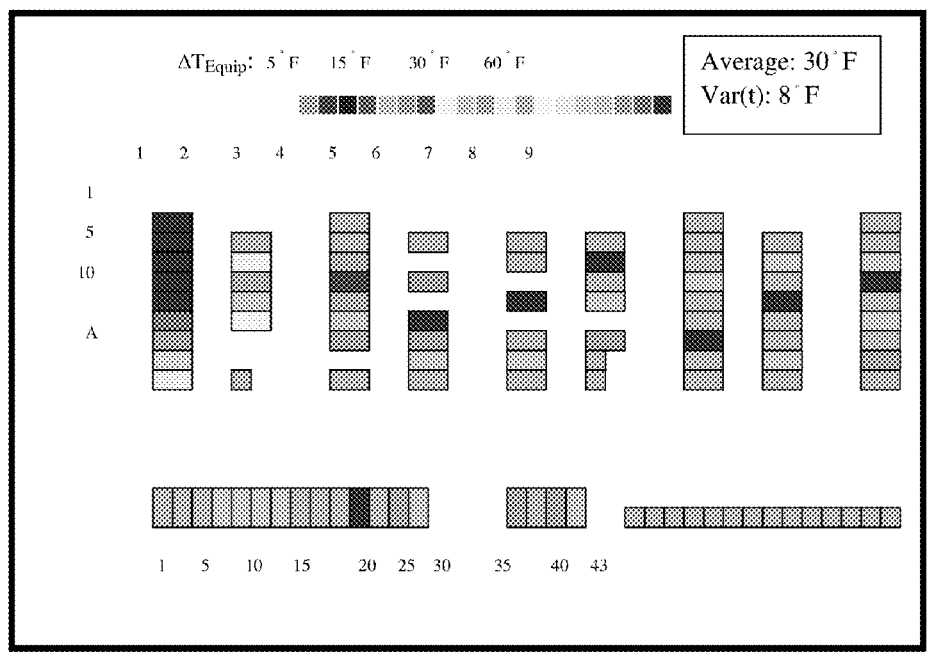
FIG. 13 is an exemplary screen display of the energy usage and conservation program according to the preferred embodiment of the present invention, illustrating the rPDU rack system cold-hot across temperature rise status.

Referring to FIG. 13, there is shown an exemplary screen display of the energy usage and conservation program according to the preferred embodiment of the present invention, illustrating the rPDU rack system cold-hot across temperature rise status by displaying the value of the Cold-Hot Across Temperatures Rise such as $\Delta T_{Equip-i}$ (° F.) which is the maximum cold-hot across temperature rise of the $j_{th}$ rPDU in the $i_{th}$ rack.

$$\Delta T_{Equip-i} = \text{Max}(T_{ij}) - \text{Min}(t_{ij}) \quad [17]$$

Where:
$T_{ij}$ is the exhaust temperature of the $j_{th}$ rPDU in the $i_{th}$ rack; and
$t_{ij}$ is the intake temperature of the $j_{th}$ rPDU in the $i_{th}$ rack.

Figure 14:
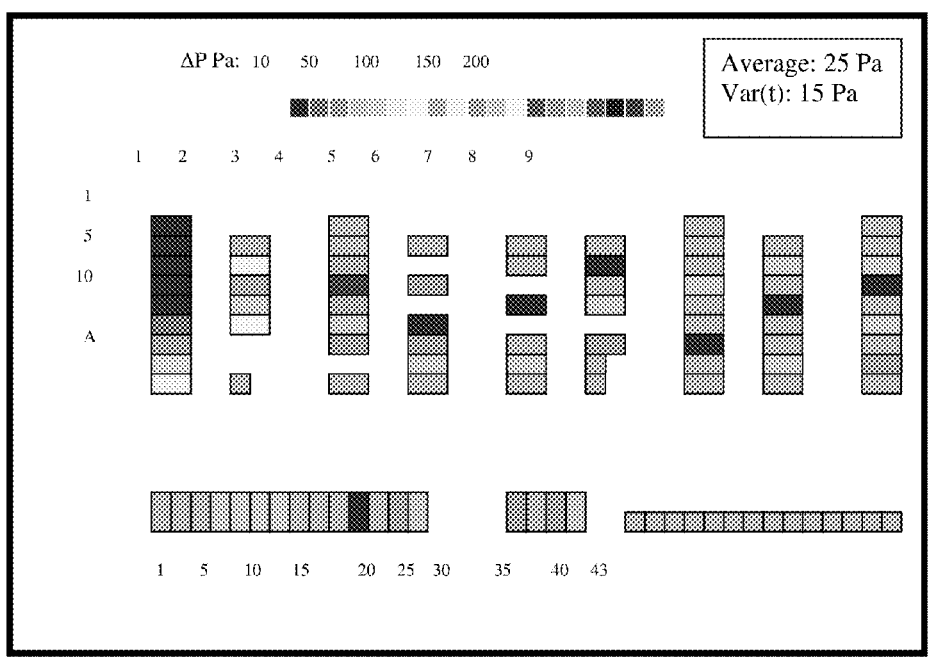
FIG. 14 is an exemplary screen display of the energy usage and conservation program according to the preferred embodiment of the present invention, illustrating the rPDU rack system intake differential pressure distribution.

Referring to FIG. 14, there is shown an exemplary screen display of the energy usage and conservation program according to the preferred embodiment of the present invention, illustrating the rPDU rack system intake differential pressure distribution by displaying the value of the Intake Differential Pressure Distribution such as $\Delta Pt_i$ (Pa) which is the intake differential pressure distribution in the raised floor under the $i_{th}$ rack.

Figure 15:
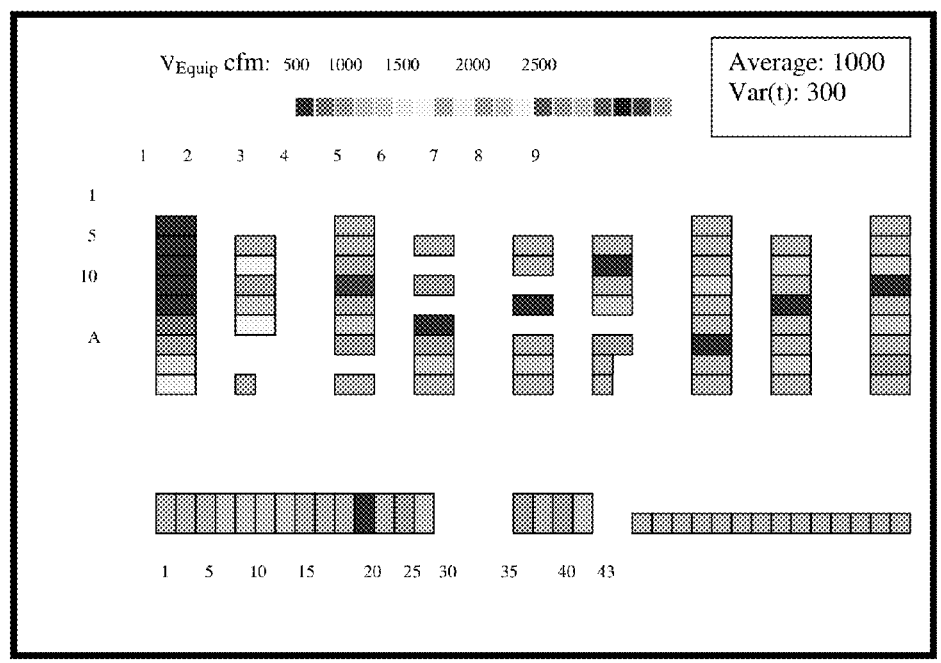
FIG. 15 is an exemplary screen display of the energy usage and conservation program according to the preferred embodiment of the present invention, illustrating the rPDU rack system heat load airflow across distribution.

Referring to FIG. 15, there is shown an exemplary screen display of the energy usage and conservation program according to the preferred embodiment of the present invention, illustrating the rPDU rack system heat load airflow across distribution by displaying the value of the Heat Load Airflow Across Distribution such as $V_{Equip-i}$ (cfm) which is the airflow across the $i_{th}$ rack.

Figure 16:
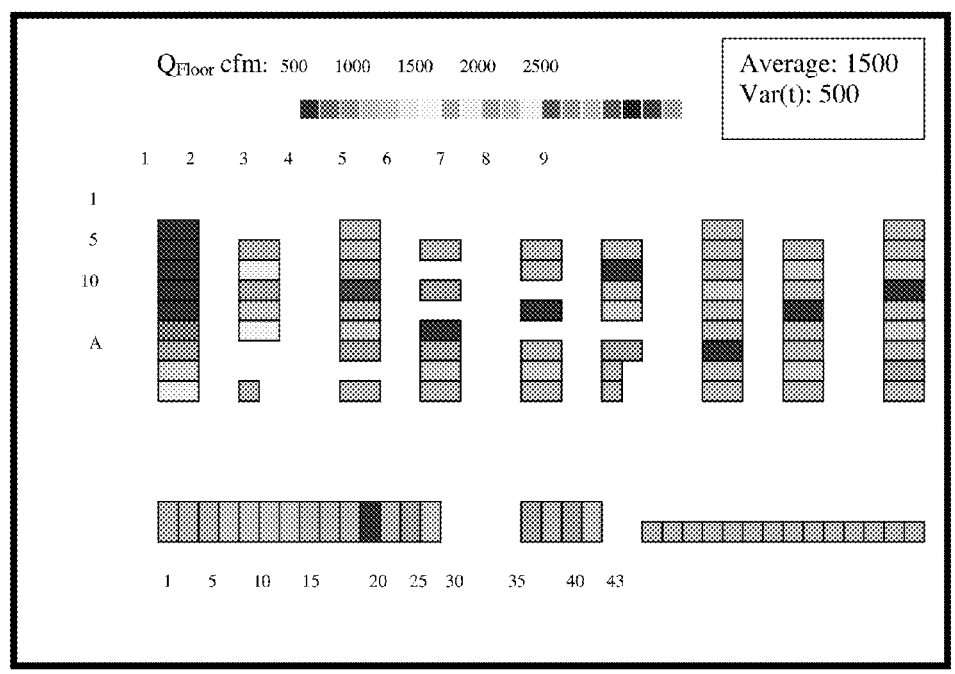
FIG. 16 is an exemplary screen display of the energy usage and conservation program according to the preferred embodiment of the present invention, illustrating the rPDU rack system floor plenum airflow supply distribution.

Referring to FIG. 16, there is shown is an exemplary screen display of the energy usage and conservation program according to the preferred embodiment of the present invention, illustrating the rPDU rack system floor plenum airflow supply distribution by displaying the value of the Floor Plenum Airflow Supply Distribution such as $Q_{floor-i}$ (cfm) which is the airflow from the floor plenum under the $i_{th}$ rack.

Figure 17:
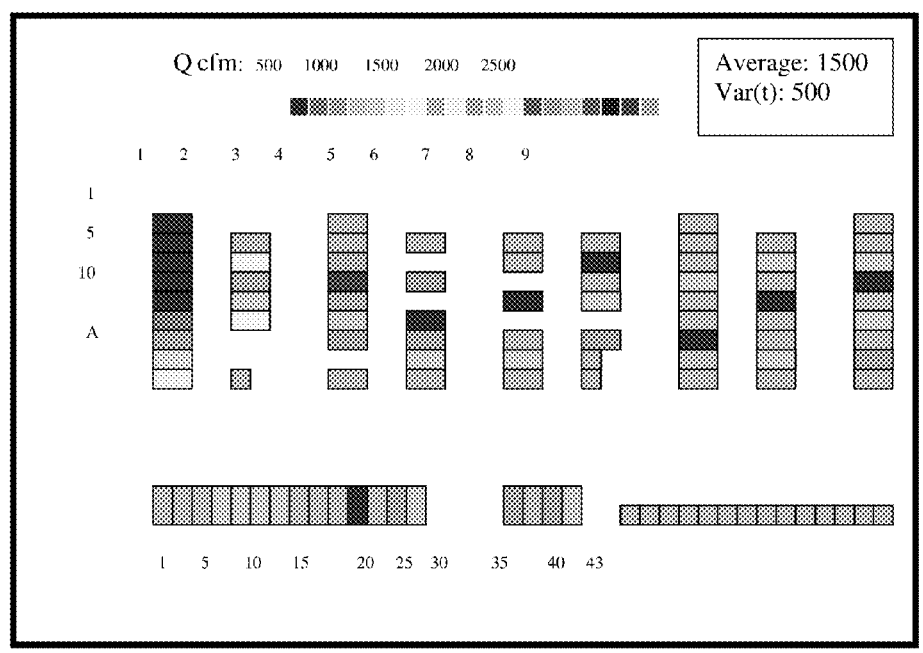
FIG. 17 is an exemplary screen display of the energy usage and conservation program according to the preferred embodiment of the present invention, illustrating the rPDU rack system heat load airflow supply distribution.

Referring to FIG. 17, there is shown an exemplary screen display of the energy usage and conservation program according to the preferred embodiment of the present invention, illustrating the rPDU rack system heat load airflow supply distribution by displaying the value of the Heat Load Airflow Supply Distribution such as $Q_i$ (cfm) which is the airflow into the $i_{th}$ rack.

$$Q_i = \left[1 - \frac{(t_{i-min} - t_{Floor-i})}{t_{Floor-i}}\right] \cdot Q_{Floor-i} \quad [18]$$

Where:
$t_{Floor-i}$ is the temperature of the floor under the $i_{th}$ rack; and
$t_{i-min}$ is the minimum intake temperature of the $i_{th}$ rack.

Figure 18:
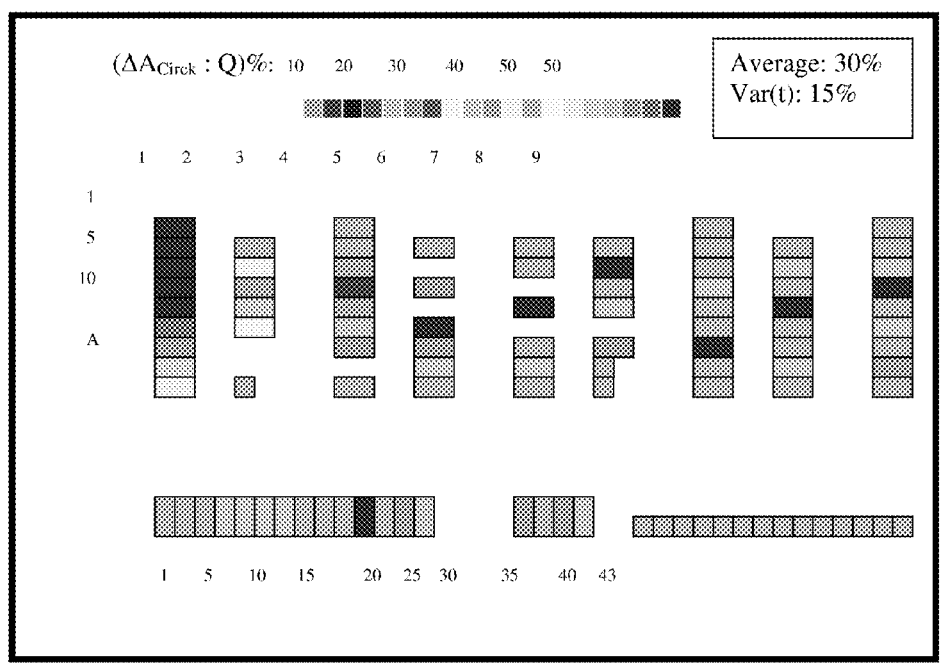
FIG. 18 is an exemplary screen display of the energy usage and conservation program according to the preferred embodiment of the present invention, illustrating the rPDU rack system hot recirculation/airflow distribution.

Referring to FIG. 18, there is shown an exemplary screen display of the energy usage and conservation program according to the preferred embodiment of the present invention, illustrating the rPDU rack system hot recirculation/airflow distribution by displaying the value of the Hot Recirculation/Airflow Distribution such as $\Delta A_{Circ-i}$ (cfm) which is the hot recirculation/airflow distribution in the $i_{th}$ rack.

$$\Delta A_{Circ-i} = \frac{\Delta t_i}{t_{i-max}} \cdot Q_i \quad [19]$$

Where:
$t_{i-max}$ is the maximum intake temperature of the $i_{th}$ rack; and
$\Delta t_i$ is the minimum intake temperature difference of the $i_{th}$ rack.

Figure 19:
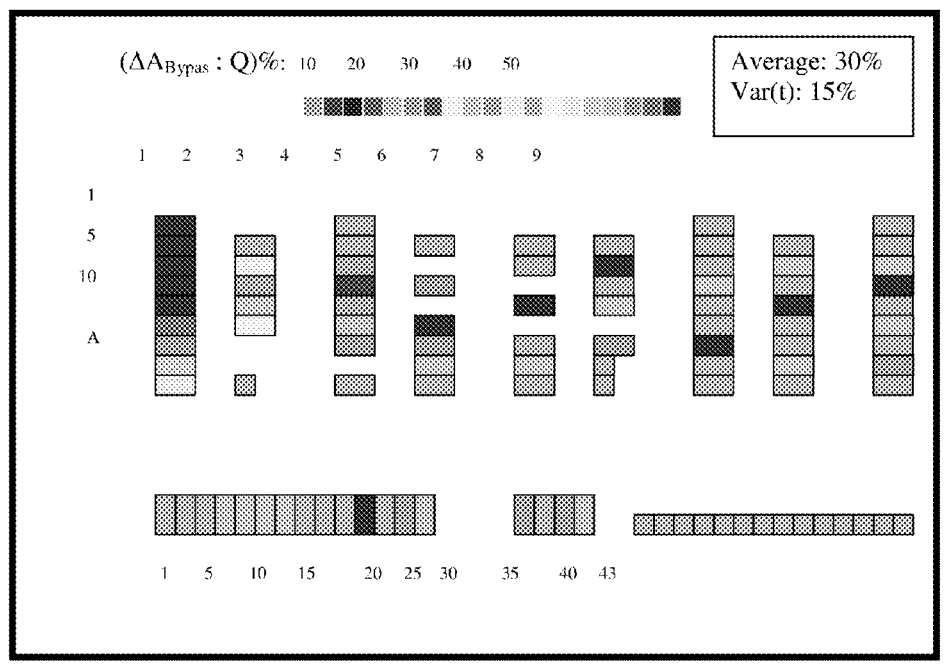
FIG. 19 is an exemplary screen display of the energy usage and conservation program according to the preferred embodiment of the present invention, illustrating the rPDU rack system cold bypass/airflow distribution.

Referring to FIG. 19, there is shown an exemplary screen display of the energy usage and conservation program according to the preferred embodiment of the present invention, illustrating the rPDU rack system cold bypass/airflow distribution by displaying the value of the Cold Bypass/Airflow Distribution such as $\Delta A_{Bypas-i}$ (cfm) which is the hot recirculation/airflow distribution in the $i_{th}$ rack.

$$\Delta A_{Bypas-i} = \frac{\Delta t_{Floor-i}}{t_{i-min}} \cdot Q_{Floor-i} \quad [20]$$

Where:
$t_{i-min}$ is the minimum intake temperature of the $i_{th}$ rack; and
$\Delta t_{Floor-i}$ is the minimum intake temperature difference in the floor under the $i_{th}$ rack.

Figure 20:
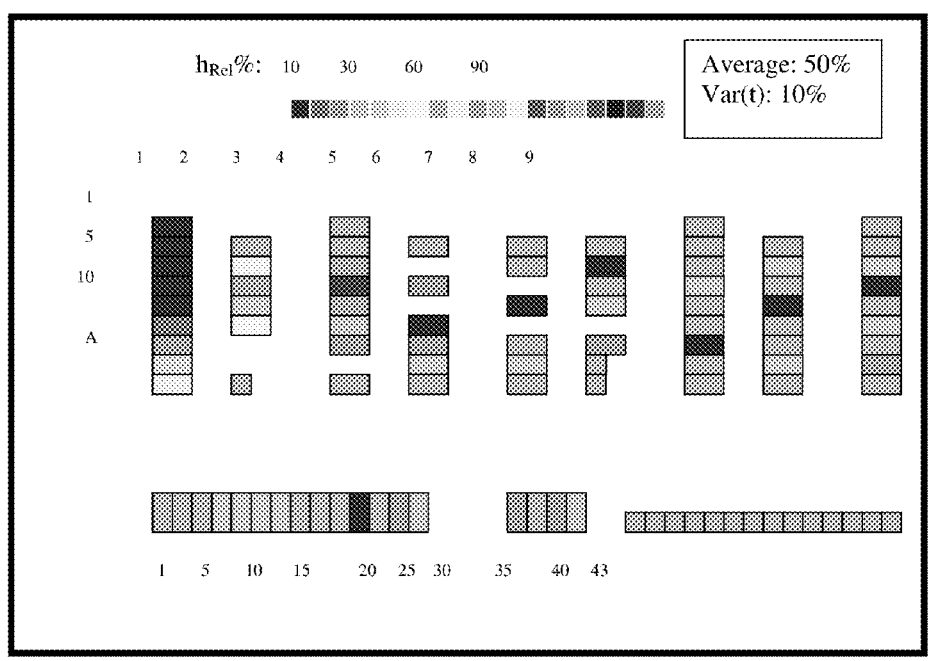
FIG. 20 is an exemplary screen display of the energy usage and conservation program according to the preferred embodiment of the present invention, illustrating the rPDU rack system cold intake relative humidity status.

Referring to FIG. 20, there is shown an exemplary screen display of the energy usage and conservation program according to the preferred embodiment of the present invention, illustrating the rPDU rack system cold intake relative humidity status by displaying the value of the Cold Intake Relative Humidity such as $h_{Rel-ij}$ (%) which is the cold intake relative humidity of the $j_{th}$ rPDU in the $i_{th}$ rack.

Figure 21:
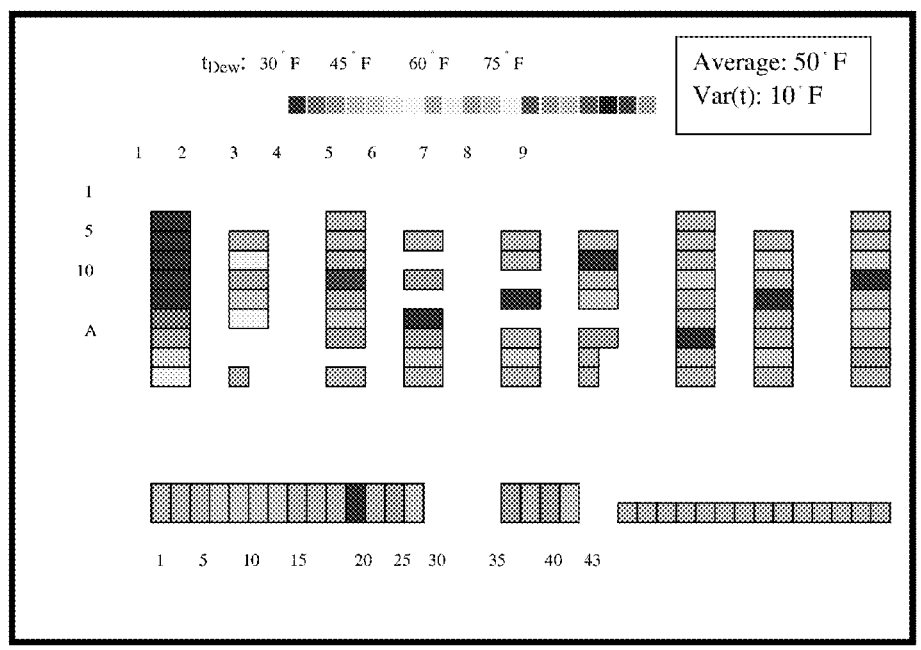
FIG. 21 is an exemplary screen display of the energy usage and conservation program according to the preferred embodiment of the present invention, illustrating the rPDU rack system cold intake dew point temperature status.
Figure 22:
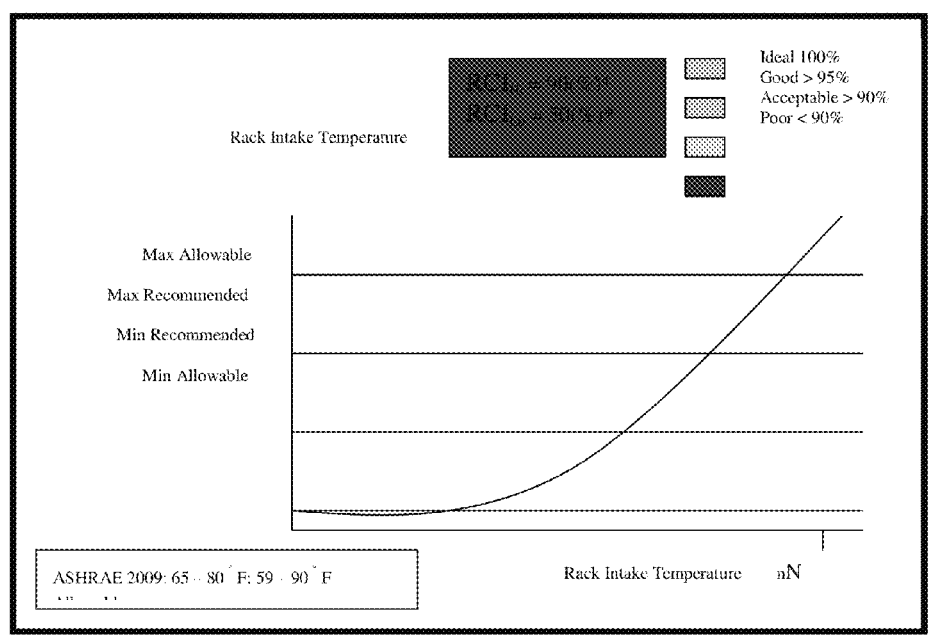
FIG. 22 is an exemplary screen display of the energy usage and conservation program according to the preferred embodiment of the present invention, illustrating the rPDU rack system overall rack cooling effectiveness.
Figure 23:
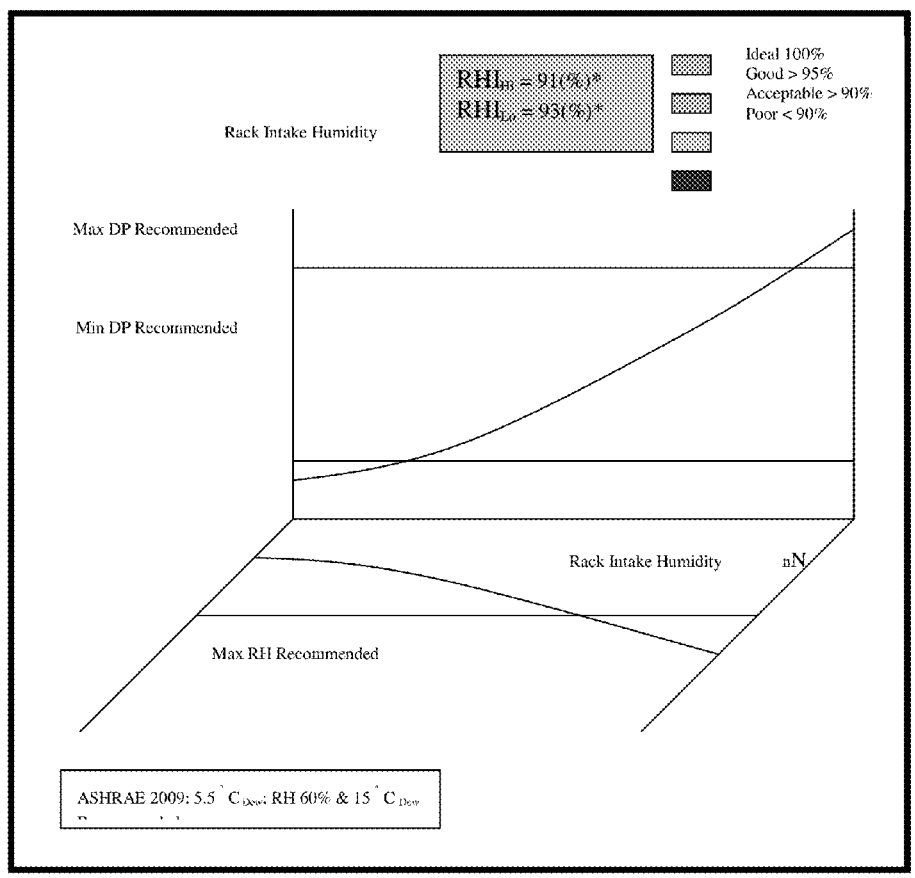
FIG. 23 is an exemplary screen display of the energy usage and conservation program according to the preferred embodiment of the present invention, illustrating the rPDU rack system overall rack humidity effectiveness.
Figure 24:
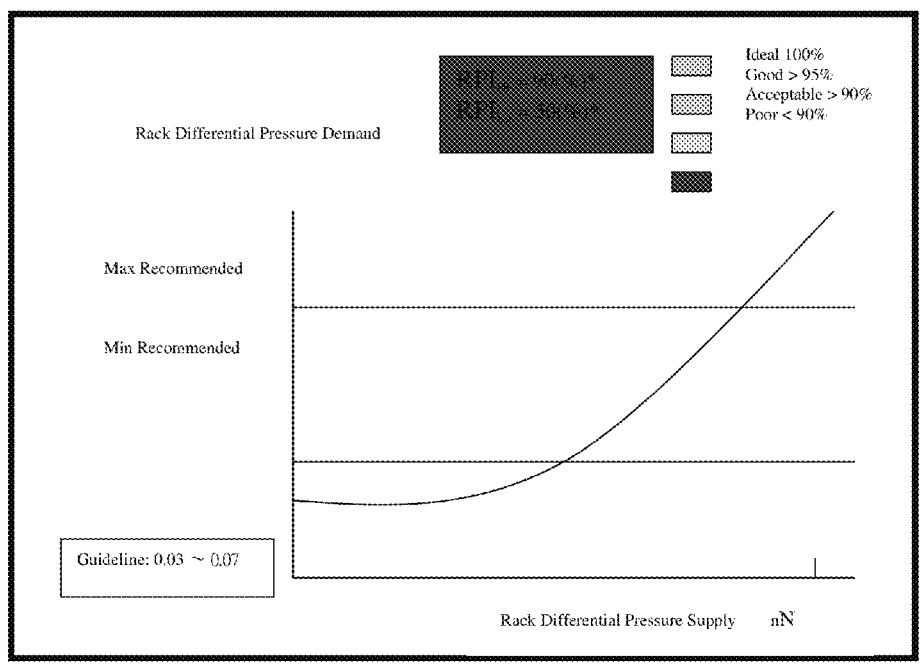
FIG. 24 is an exemplary screen display of the energy usage and conservation program according to the preferred embodiment of the present invention, illustrating the rPDU rack system overall rack differential pressure effectiveness.
Figure 25:
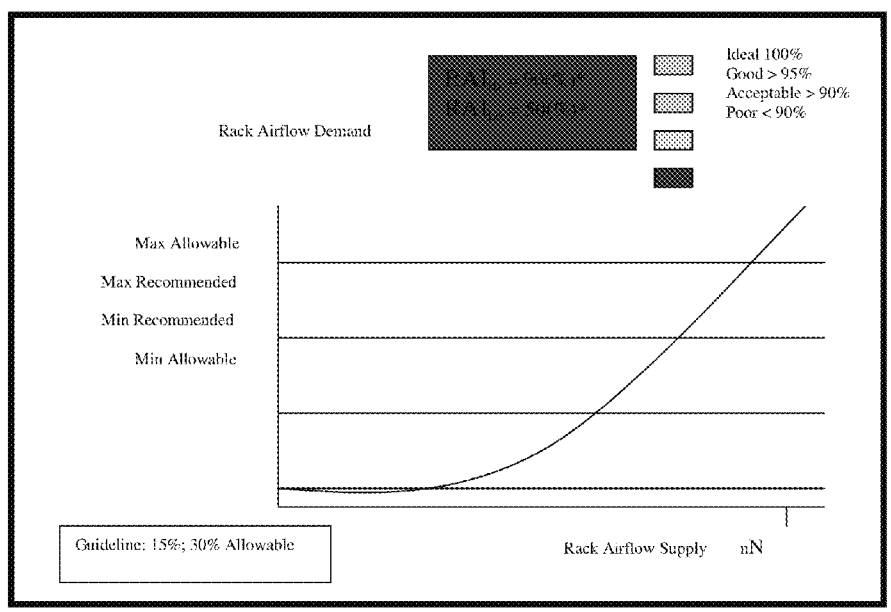
FIG. 25 is an exemplary screen display of the energy usage and conservation program according to the preferred embodiment of the present invention, illustrating the rPDU rack system overall rack airflow effectiveness.

Referring to FIG. 21, there is shown is an exemplary screen display of the energy usage and conservation program according to the preferred embodiment of the present invention, illustrating the rPDU rack system cold intake dew point temperature status by displaying the value of the Cold Intake Dew Point Temperature such as $t_{Dew-ij}$ (° F.) which is the cold intake dew point temperature of the $j_{th}$ rPDU in the $i_{th}$ rack. Dew point temperature may be obtained by Magnus-Tetens Approximation.

Referring to FIGS. 22-25, there are shown exemplary screen displays of the energy usage and conservation program according to the preferred embodiment of the present invention, illustrating RCI, RHI, RPI and RAI curves demonstrating respectively the overall rack cooling, humidity, differential pressure and airflow effectiveness. Generally, index values below 90% are poor, above 90% are acceptable, above 95% are good, and approaching 100% are ideal.

Figure 26:
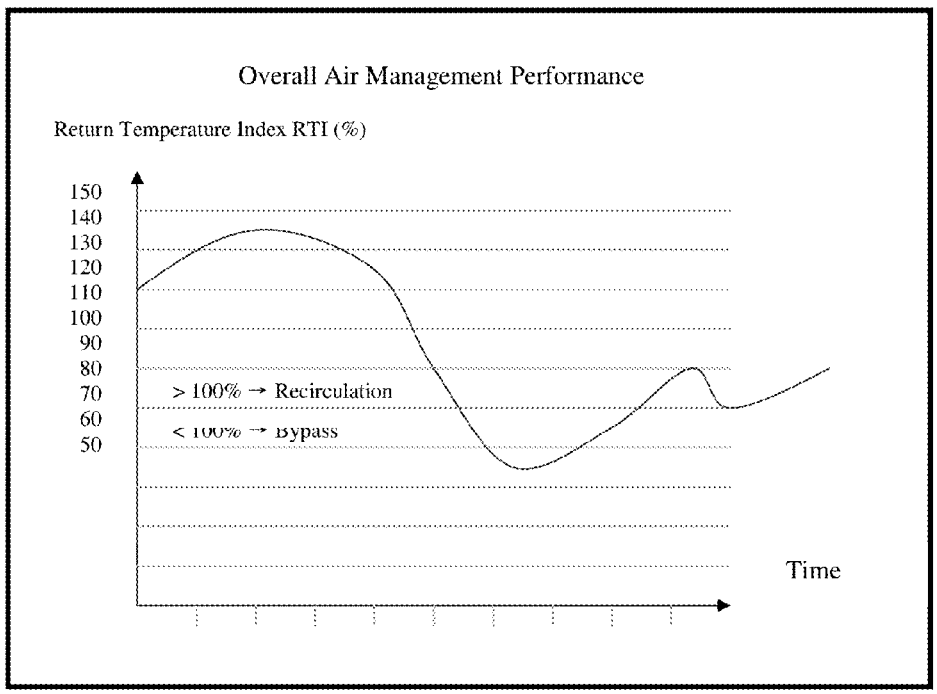
FIG. 26 is an exemplary screen display of the energy usage and conservation program according to the preferred embodiment of the present invention, illustrating the rPDU rack system overall air management performance.

Referring to FIG. 26, there is shown an exemplary screen display of the energy usage and conservation program according to the preferred embodiment of the present invention, illustrating the rPDU rack system overall. Generally, an RTI index value above or below 100% indicates hot air recirculation or cold air bypass, respectively, and an RTI value approaching 100% is ideal.

Figure 27:
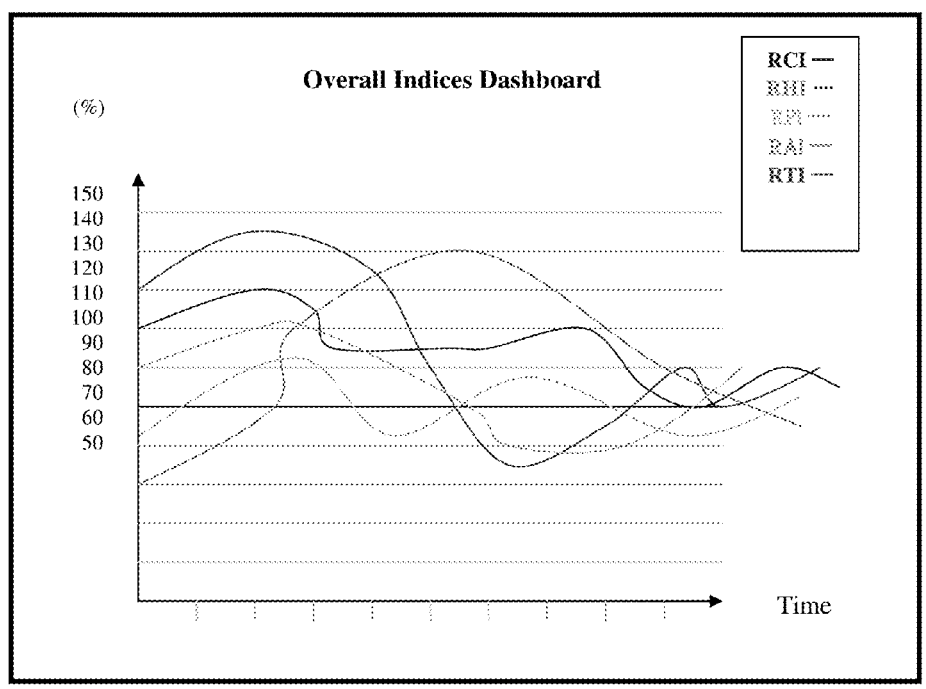
FIG. 27 is an exemplary screen display of the energy usage and conservation program according to the preferred embodiment of the present invention, illustrating the rPDU rack system overall indices dashboard.

Referring to FIG. 27, there is shown an exemplary screen display of the energy usage and conservation program according to the preferred embodiment of the present invention, illustrating the rPDU rack system overall indices dashboard. The index curves demonstrate the inter-dependency of the indices. For example, increasing airflow and reducing temperature may result in higher RCI, RPI and RAI indices. However, such maneuver costs more energy and hence results in a lower RTI index. The ultimate goal of the air-management system is to adjust the operation of the CRAC/CRAH units to improve all indices, for example, by effectively avoiding or eliminating hot air recirculation and cold air bypass in the rack system. While it may be difficult to make the values of all indices exactly 100%, the system will be in an ideal status in energy usage and conservation when these indices are all very close to 100%. An optimal status may be achieved when the values of all indices are above 95%.

Figure 28:
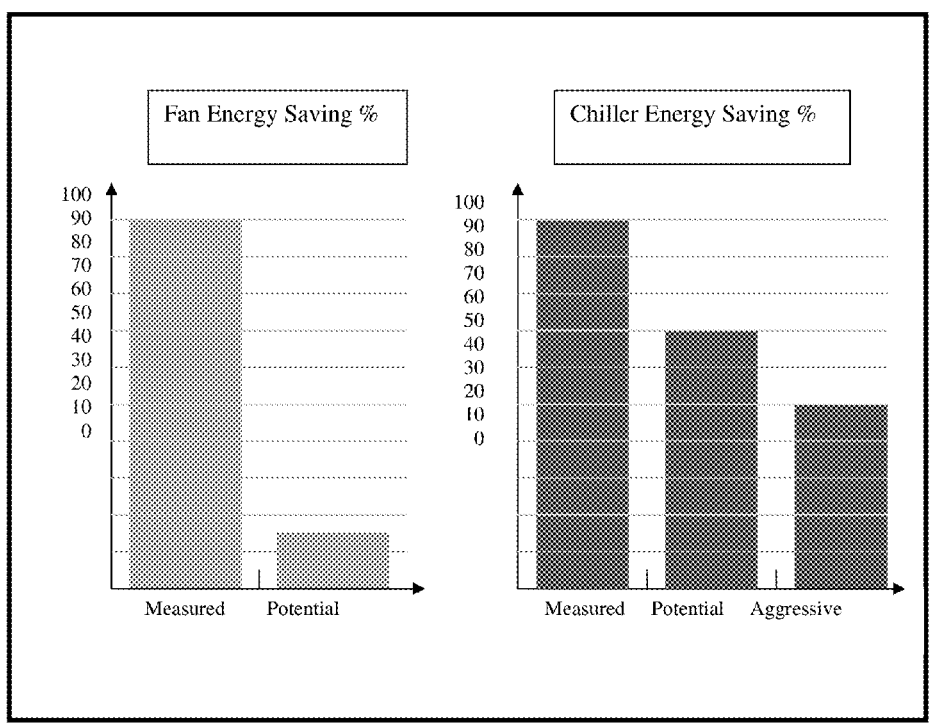
FIG. 28 is an exemplary screen display of the energy usage and conservation program according to the preferred embodiment of the present invention, illustrating the rPDU rack system energy saving estimates.

Referring to FIG. 28, there is shown an exemplary screen display of the energy usage and conservation program according to the preferred embodiment of the present invention, illustrating the rPDU rack system energy saving estimates. The CRAC/CRAH fan and chiller energy saving may be estimate as follows:

$$\text{Fan Energy Saving} = (RTI/100)^e \times 100\% \quad [21]$$

$$\text{Chiller Energy Saving} = \{100 - [(t_{max-rec} - t_{wt-floor}) \times f]\} \times 100\% \quad [22]$$

A more aggressive estimate of the chiller energy saving may be calculated as follows:

$$\text{Chiller Energy Saving} = \{100 - [(t_{max-all} - t_{wt-floor}) \times f]\} \times 100\% \quad [23]$$

Where:
  e=2.8
  f=2
  $t_{wt\text{-}floor}$ is weighted temperature of the airflow in the raised floor;
  $t_{max\text{-}rec}$ is the maximum recommended intake temperature; and
  $t_{max\text{-}all}$ is the maximum allowable intake temperature.

With the input provided by the sensors, the control computer can easily calculate the fan and chiller energy saving estimates, which provide valuable energy usage and conservation information to the operators/managers of the data center.

The present invention energy usage and conservation system and method have many advantages. The present invention system and method automatically receive inputs from the multiple strategically placed sensors to obtain critical operation data such as power usage, temperature, humidity, airflow, pressure, etc. without the need of manual data input, and calculate the effectiveness of the power usage, cooling temperature, air humidity, fan speed, pressure differential, etc., to instantaneously and continuously provide automated adjustment of the CRAC/CRAH unit operation which results in optimal usage and conservation of electrical power and energy, while ensuring the safety of the electronic devices and system operation. The present invention sensor arrangement are not materially affected by any load and other hardware changes in the rPDU rack system and an increased number of sensors may be used to increase the accuracy of the measurement and calculation without any significant need of computer or network configuration change.

Although examples of the preferred embodiments of the present invention system and method are shown and described in detail above, the present invention is not limited to the specifics described herein. It will be apparent to those skilled in the art that various modification and variations can be made in the system and method of the present invention without departing from the spirit or scope of the invention. Thus, it is intended that the present invention cover modifications and variations that come within the scope of the appended claims and their equivalents.

What is claimed is:

1. A system for improving energy usage and conservation of at least one air-management unit for a multiplicity of electronic devices mounted on a plurality of racks, comprising:
    a group of sensors including power load sensors, temperature sensors, humidity sensors, and differential pressure sensors for sensing power load, temperature, humidity and differential pressures throughout the plurality of racks; and
    a computer coupled to the group of sensors through a network interface for automatically receiving data from the group of sensors and calculating multiple indices reflecting the operation effectiveness and energy efficiency of the air-management unit, including a rack cooling index RCI which has two parts $RCI_{Hi}$ and $RCI_{Lo}$ describing respectively a temperature environment at an upper threshold and lower threshold of a safe temperature range, a rack humidity index RHI which has two parts $RHI_{Hi}$ and $RHI_{Lo}$ describing respectively a computer room humidity environment at an upper threshold and lower threshold of a safe humidity range, a rack airflow index RAI which has two parts $RAI_{Hi}$ and $RAI_{Lo}$ describing respectively an airflow at an upper threshold and a lower threshold of a safe airflow range, a rack differential pressure index RPI which has two parts $RPI_{Hi}$ and $RPI_{Lo}$ describing respectively an airflow at an upper threshold and a lower threshold of a safe airflow range, and a return temperature index RTI which is calculated from temperatures of a supply airflow and a return airflow and a temperature raise across the racks, such that the operation of the air-management unit can be adjusted accordingly to achieve an optimal efficiency of safe energy usage and conservation.

2. The system of claim 1, wherein a multiplicity of rack mounted power distribution units are used for power distribution to the multiplicity of electronic devices mounted on the plurality of racks, the plurality of racks are based on a raised floor of at least one computer room, and the raised floor contains air conduit for circulating air conditioned by and supplied from the at least one air-management unit to the plurality of racks to ensure a safe operating environment for the multiplicity of electronic devices.

3. The system of claim 1, wherein each of the plurality of racks has a cabinet for enclosing the electronic devices mounted therein.

4. The system of claim 3, wherein the cabinet of each of the plurality of racks is divided by a partitioning wall into a front partition for circulating cold air and a rear partition for circulating hot air.

5. The system of claim 4, wherein a sub-group of sensors from the group of sensors are positioned in the front partition of the cabinet of each of the plurality of racks and another sub-group of sensor from the group of sensors are positioned in the rear partition of the cabinet of each of the plurality of racks such that difference in operating environment in the front and rear partitions can be sensed.

6. The system of claim 1, wherein at least one differential pressure sensor is positioned in the raised floor adjacent to each of the plurality of racks.

7. The system of claim 1, further comprising a microprocessor unit for each power distribution unit, the microprocessor unit coupled to at least one sensor for processing data from the at least one sensor and sending the data to the computer via the network interface.

8. The system of claim 7, further comprising at least one sensor circuit coupled to the microprocessor unit for assisting the processing of data from the at least one sensor.

9. The system of claim 8, wherein the at least one sensor circuit includes an amplitude sensor circuit.

10. The system of claim 8, wherein the at least one sensor circuit includes a voltage sensor circuit.

11. The system of claim 1, wherein the computer further calculates at least one energy saving estimate based on the data from the group of sensors.

12. A system for improving air-management of a multiplicity of electronic devices, comprising:
    at least one differential pressure sensor for sensing differential pressure of a cooling airflow supplied to the multiplicity of electronic devices; and a data processing unit coupled to the at least one differential pressure sensor for automatically processing data from the at least one differential pressure sensors and analyzing the operation effectiveness and energy efficiency of the cooling airflow, including calculating a rack differential pressure index RPI, which has two parts $RPI_{Hi}$ and $RPI_{Lo}$ describing respectively an airflow at an upper threshold and a lower threshold of a safe airflow range, based on the data from the at least one differential pressure sensors, and comparing the calculated RPI with predetermined thresholds to determine adjustments of the airflow or pressure differential or both of the cooling airflow.

13. The system of claim 12, wherein the multiplicity of electronic devices are mounted on a plurality of racks in at least one computer room of a data center, and a multiplicity of rack mounted power distribution units are used for power distribution to the multiplicity of electronic devices.

14. The system of claim 12, further comprising at least one temperature sensor coupled to the data processing unit which also automatically calculates a rack cooling index (RCI) and a return temperature index (RTI).

15. The system of claim 14, wherein the data processing unit also automatically calculates recirculation airflow based on data from at least one temperature sensor.

16. The system of claim 12, further comprising a humidity sensor coupled to the data processing unit which also automatically calculates a rack humidity index (RHI).

17. The system of claim 12, further comprising an airflow sensor coupled to the data processing unit which also automatically calculates a rack airflow index (RAI).

18. The system of claim 12, wherein the data processing unit also automatically calculates additional airflow needed by the power distribution units and causes additional airflow be provided to the power distribution units.

19. The system of claim 12, wherein the data processing unit also automatically calculates a rack differential pressure index (RPI) based on the data from at least one differential pressure sensor.

20. The system of claim 19, wherein the data processing unit also automatically calculates bypass airflow based on data from at least one differential pressure sensor.

21. A rack mounted power distribution unit coupled to a group of sensors and situated in at least one computer room that has a computer for air-management of the at least one computer room and a multiplicity of rack mounted electronic devices in the at least one computer room, comprising:
a microprocessor coupled to the group of sensors for automatically processing data from the sensors;
the group of sensors including at least one differential pressure sensor for sensing differential pressure of a cooling airflow supplied to the multiplicity of electronic devices; and
the microprocessor sending the data from the sensors to the computer via a network interface for analyzing the operation effectiveness and energy efficiency of the cooling airflow, including calculating a rack differential pressure index RPI, which has two parts $RPI_{Hi}$ and $RPI_{Lo}$ describing respectively an airflow at an upper threshold and a lower threshold of a safe airflow range, based on the data from the at least one differential pressure sensors, and comparing the calculated RPI with predetermined thresholds to determine adjustments of the airflow or pressure differential or both of the cooling airflow.

22. The rack mounted power distribution unit of claim 21, further comprising at least one sensor circuit coupled to the microprocessor for assisting the processing of data from the group of sensors.

23. A method for improving energy usage and conservation of at least one air-management unit for a multiplicity of electronic devices mounted on a plurality of racks, comprising the steps of:
providing a group of sensors including power load sensors, temperature sensors, humidity sensors, and differential pressure sensors for sensing power load, temperature, humidity and differential pressures throughout the plurality of racks;
coupling a computer to the group of sensors through a network interface for automatically receiving data from the group of sensors; and
calculating multiple indices reflecting the operation effectiveness and energy efficiency of the air-management unit, including a rack cooling index RCI which has two parts $RCI_{Hi}$ and $RCI_{Lo}$ describing respectively a temperature environment at an upper threshold and lower threshold of a safe temperature range, a rack humidity index RHI which has two parts $RHI_{Hi}$ and $RHI_{Lo}$ describing respectively a computer room humidity environment at an upper threshold and lower threshold of a safe humidity range, a rack airflow index RAI which has two parts $RAI_{Hi}$ and $RAI_{Lo}$ describing respectively an airflow at an upper threshold and a lower threshold of a safe airflow range, a rack differential pressure index RPI which has two parts $RPI_{Hi}$ and $RPI_{Lo}$ describing respectively an airflow at an upper threshold and a lower threshold of a safe airflow range, and a return temperature index RTI which is calculated from temperatures of a supply airflow and a return airflow and a temperature raise across the rack, based on the data from the group of sensors to achieve an optimal efficiency of safe energy usage and conservation.

24. The method of claim 23, wherein a multiplicity of rack mounted power distribution units are used for power distribution to the multiplicity of electronic devices mounted on the plurality of racks, the plurality of racks are based on a raised floor of at least one computer room, and the raised floor contains air conduit for circulating air conditioned by and supplied from the at least one air-management unit to the plurality of racks to ensure a safe operating environment for the multiplicity of electronic devices.

25. The method of claim 23, further comprising a step of partitioning an internal space of each rack cabinet into a front partition for circulating cold air and a rear partition for circulating hot air.

26. The method of claim 25, further comprising a step of positioning a sub-group of sensors from the group of sensors in the front partition of each rack cabinet and positioning another sub-group of sensor from the group of sensors in the rear partition of each rack cabinet such that difference in operating environment in the front and rear partitions can be sensed.

27. The method of claim 23, further comprising a step of positioning at least one differential pressure sensor in the raised floor adjacent to each rack.

28. The method of claim 23, further comprising the steps of:
providing a microprocessor unit to each power distribution unit; and
coupling the microprocessor unit to at least one sensor for processing data from the at least one sensor and sending the data to the computer via the network interface.

29. The method of claim 23, further comprising a step of coupling at least one sensor circuit to the microprocessor unit for assisting the processing of data from the at least one sensor.

30. The method of claim 29, wherein the at least one sensor circuit includes an amplitude sensor circuit.

31. The device of claim 29, wherein the at least one sensor circuit includes a voltage sensor circuit.

32. The method of claim 23, further comprising a step of calculating at least one energy saving estimate based on the data from the group of sensors.

33. The method of claim 23, further comprising the steps of:
- making operational adjustment to the air-management unit and recalculate the multiple indices; and
- repeating the adjustment step until the recalculated values of the multiple indices are all above 95%.

34. A method for improving energy usage and conservation of at least one air-management unit for a multiplicity of electronic devices mounted on a plurality of racks, comprising the steps of:
- providing a group of sensors including power load sensors, temperature sensors, humidity sensors, and differential pressure sensors for sensing power load, temperature, humidity and differential pressures throughout the plurality of racks;
- coupling a computer to the group of sensors through a network interface for automatically receiving data from the group of sensors;
- adjusting air conditioning units, comprising:
  - calculating a rack airflow index RAI and a rack differential pressure index RPI, and if the RAI and RPI do not meet first predefined standards, adjusting an airflow or a pressure differential of the cooling air or both;
  - calculating a rack cooling index RCI and a rack humidity index RHI, and if the RCI and RHI do not meet second predefined standards, adjusting a temperature or humidity of the cooling air or both;
  - calculating a return temperature index RTI, and if the RTI does not meet a third predefined standard, increasing the temperature and decreasing the airflow of the cooling air; and
  - repeating the calculating and adjusting steps until the RAI, RPI, RCI, RHI and RTI meet the respective predefined standards;

wherein the RAI, RPI, RCI, RHI and RTI are inter-dependent and adjusting any one of the airflow, pressure differential, temperature or humidity of the cooling air affects more than one of the RAI, RPI, RCI, RHI and RTI.

35. The method of claim 34, wherein
the rack cooling index RCI has two parts $RCI_{Hi}$ and $RCI_{Lo}$ describing respectively a temperature environment at an upper threshold and lower threshold of a safe temperature range,
the rack humidity index RHI has two parts $RHI_{Hi}$ and $RHI_{Lo}$ describing respectively a computer room humidity environment at an upper threshold and lower threshold of a safe humidity range,
the rack airflow index RAI has two parts $RAI_{Hi}$ and $RAI_{Lo}$ describing respectively an airflow at an upper threshold and a lower threshold of a safe airflow range,
the rack differential pressure index RPI has two parts $RPI_{Hi}$ and $RPI_{Lo}$ describing respectively an airflow at an upper threshold and a lower threshold of a safe airflow range, and
the return temperature index RTI is calculated from temperatures of a supply airflow and a return airflow and a temperature rise across the rack.

* * * * *